(12) United States Patent
Yoshino

(10) Patent No.: US 7,409,067 B2
(45) Date of Patent: Aug. 5, 2008

(54) METHOD AND APPARATUS FOR ADJUSTING FREQUENCY CHARACTERISTIC OF SIGNAL

(75) Inventor: Hajime Yoshino, Tokorozawa (JP)

(73) Assignee: Pioneer Corporation, Tokyo-to (JP)

( * ) Notice: Subject to any disclaimer, the term of this patent is extended or adjusted under 35 U.S.C. 154(b) by 788 days.

(21) Appl. No.: 10/620,802

(22) Filed: Jul. 17, 2003

(65) Prior Publication Data
US 2004/0071299 A1 Apr. 15, 2004

(30) Foreign Application Priority Data
Jul. 19, 2002 (JP) ............................ P2002-211684

(51) Int. Cl.
H03G 5/00 (2006.01)
H03G 3/00 (2006.01)
H03G 9/00 (2006.01)
H03G 5/02 (2006.01)

(52) U.S. Cl. ..................... 381/98; 381/99; 381/102; 381/103; 381/104; 381/107; 333/28 T

(58) Field of Classification Search ............... 381/98, 381/103, 102, 104, 107, 17, 99, 97, 58, 61; 333/28 T
See application file for complete search history.

(56) References Cited

U.S. PATENT DOCUMENTS

| | | | |
|---|---|---|---|
| 4,458,362 A * | 7/1984 | Berkovitz et al. ........... 381/103 |
| 4,688,258 A | 8/1987 | Kunugi et al. ............... 381/103 |
| 4,972,489 A * | 11/1990 | Oki et al. ...................... 381/97 |
| 5,506,910 A | 4/1996 | Miller et al. ................. 381/103 |
| 5,515,446 A * | 5/1996 | Velmer ......................... 381/98 |
| 5,987,145 A | 11/1999 | Lawton ....................... 381/103 |
| 6,072,879 A * | 6/2000 | Ouchi et al. .................. 381/61 |
| 6,996,240 B1 * | 2/2006 | Sasaki .......................... 381/58 |

FOREIGN PATENT DOCUMENTS

JP   10 136 498   6/1998

* cited by examiner

*Primary Examiner*—Vivian Chin
*Assistant Examiner*—Devona Faulk
(74) *Attorney, Agent, or Firm*—Drinker Biddle & Reath LLP

(57) ABSTRACT

In a frequency characteristic adjustment apparatus incorporated in an audio system, a frequency characteristic of an audio signal is made to agree with a target frequency characteristic, thus providing an equalizing function. In the apparatus, by a frequency characteristic controller, a measurement signal is detected as a sound-collected signal that received by way of speakers/microphone, and the sound-collected signal is divided into a signal component falling into a one fixed-level band and one or more signal components falling into one or more variable-level bands. A relative level of the signal component in each variable-level band is estimated on the basis of a level of the signal component in the fixed-level band in the target frequency characteristic. Based on the estimated relative levels, the levels at equalizers are set, so that the levels of signal components of the signal are adjusted by the equalizers channel by channel.

12 Claims, 11 Drawing Sheets

METHOD AND APPARATUS FOR ADJUSTING FREQUENCY CHARACTERISTIC OF SIGNAL

BACKGROUND OF THE INVENTION

1. Field of the Invention

The present invention relates to a method and apparatus for adjusting a frequency characteristic of a signal, and in particular to the method and system that can be reduced into practice, for example, as an equalizer to adjust the frequency characteristic of an audio signal.

2. Description of Related Art

In general, an audio system with which a user can enjoy music and movies recorded on compact discs (CDs) and DVDs (Digital Versatile Discs) is provided with a graphic equalizer. The graphic equalizer includes circuitry to divide an audio signal into signal components falling into a plurality of frequency bands and to enhance (boost) or attenuate (cut) the level of each signal component in each frequency band. Such adjustment for each frequency band enables the frequency characteristic of an audio signal to be adjusted, so that the frequency characteristic agrees with the acoustic characteristic of speakers and other audio devices, and is matched with environments in which music or movies are appreciated.

A multi-channel surround-sound audio system, which has been in widespread use recently, is composed of five to eight channels, for example and provided with an amplifying unit to control audio outputs from those channels and speakers in charge of audio output from each channel.

The multi-channel surround-sound audio system realizes a surround-sound reproduction by adequately positioning the speakers. In this system, it is required that a sound pressure level and a frequency characteristic of each audio signal are appropriately set to match the characteristic of each speaker.

In order to meet such requirement, there are provided an equalizer and an amplifier, channel by channel, in most of the amplifying units of the multi-channel surround-sound audio systems.

On the other hand, the multi-channel surround-sound audio systems include an audio system provided with an automatic sound-field correction system to automatically correct a sound pressure level and a frequency characteristic of each audio signal.

The automatic sound-field correction system is able to detect and analyze the positions and characteristics of speakers and environments of a room in which the speakers are placed and to use the analyzed results so that a frequency characteristic (i.e., a target frequency characteristic) to be given to an audio signal in each channel is calculated. And the correction system is capable of enhancing or attenuating a level of a signal component in each band of each audio signal, thus atomically controlling the frequency characteristic of each audio signal.

However, the conventional equalizer has suffered the situation where the larger the number of bands (i.e., the number of divided frequency bands), the higher resolution in frequency, thus more accurate adjustment of the frequency characteristics, while the higher manufacturing cost for audio systems.

In contrast, in the conventional equalizer, if the number of bands is lessened, the manufacturing cost will be reduced, but the frequency resolution will become deteriorated, thus lowering accuracy in the frequency characteristic adjustment. That is, there is a confliction between sustaining or improving accuracy in the frequency characteristic adjustment and reducing the manufacturing cost of audio systems.

Further, the conventional audio system with the equalizer is also provided with amplifiers and attenuators placed after the equalizer in order to increase or lower, as a whole, the levels of audio signals outputted from the equalizer for adjustment of changes in the audio signals occurring due to control in the equalizer. In this case, however, when the levels of the audio signals from the equalizer are raised by the amplifiers, there occurs a problem that noise mixed with the audio signals is also amplified together. This lowers a signal to noise ratio in an audio system, thus deteriorating sound reproduction with higher quality.

SUMMARY OF THE INVENTION

The present invention has been made in view of the above circumstances, and an object of the present invention is, therefore, to provide a method and apparatus that enables adjustment of the frequency characteristic to be performed with accuracy kept highly, with manufacturing cost for the apparatus still suppressed from being raised.

In order to accomplish the above object, as one aspect of the present invention, there is provided a frequency characteristic adjustment apparatus in which an inputted signal is subjected to adjustment for making a frequency characteristic of the signal agree with a target frequency characteristic, the apparatus comprising: an estimation device configured to divide the inputted signal into a signal component falling into a one fixed-level band and one or more signal components falling into one or more variable-level bands and to estimate a relative level of the signal component in each variable-level band on the basis of a level of the signal component in the fixed-level band in the target frequency characteristic; an adjustment device configured to adjust the level of the signal component of each variable-level band of the signal based on the estimated relative level of the signal component in each variable-level band; and an output device configured to output the signal adjusted by the adjustment device.

As another aspect of the present invention, there is a frequency characteristic adjustment apparatus, comprising: an adjustment device configured to divide the inputted audio signal into a signal component falling into one fixed-level band and one or more signal components falling into one or more variable-level bands and to adjust levels of the signal components in only the variable-level bands of the audio signal; and an output device configured to output the audio signal adjusted by the adjustment device, wherein the adjustment device is configured to assign, to the fixed-level band, a predetermined frequency band in which changes in sound pressure are sensitive to human audibility and to divide the inputted audio signal.

Still another aspect of the present invention is directed to a program, carried out by a computer, for adjusting a frequency characteristic of an inputted signal so that the frequency characteristic of the signal agrees with a target frequency characteristic, the program making the computer have the functions of: receiving the inputted signal; dividing the received signal into a signal component falling into a one fixed-level band and one or more signal components falling into one or more variable-level bands; estimating a relative level of the signal component in each variable-level band on the basis of a level of the signal component in the fixed-level band in the target frequency characteristic; adjusting the level of the signal component of each variable-level band of the signal based on the estimated relative level of the signal component in each variable-level band; and outputting the adjusted signal.

Another aspect of the present invention is that a method of adjusting a frequency characteristic of an inputted signal so that the frequency characteristic of the signal agrees with a target frequency characteristic, the method comprising the steps of: receiving the inputted signal; dividing the received signal into a signal component falling into a one fixed-level band and one or more signal components falling into one or more variable-level bands; estimating a relative level of the signal component in each variable-level band on the basis of a level of the signal component in the fixed-level band in the target frequency characteristic; adjusting the level of the signal component of each variable-level band of the signal based on the estimated relative level of the signal component in each variable-level band; and outputting the signal adjusted by the adjustment step.

Still another aspect, the present invention is provided as a method of adjusting a frequency characteristic of an inputted audio signal so that the frequency characteristic of the audio signal agrees with a target frequency characteristic, the method comprising the steps of: receiving the inputted audio signal; dividing the received audio signal into a signal component falling into one fixed-level band and one or more signal components falling into one or more variable-level bands, a predetermined frequency band in which changes in sound pressure are sensitive to human audibility being assigned to the fixed-level band; adjusting levels of the signal components in only the variable-level bands of the audio signal; and outputting the audio signal adjusted by the adjustment step.

BRIEF DESCRIPTION OF THE DRAWINGS

Other objects and aspects of the present invention will become apparent from the following description and embodiments with reference to the accompanying drawings in which.

DETAILED DESCRIPTION OF PREFERRED EMBODIMENTS

Figure 1:
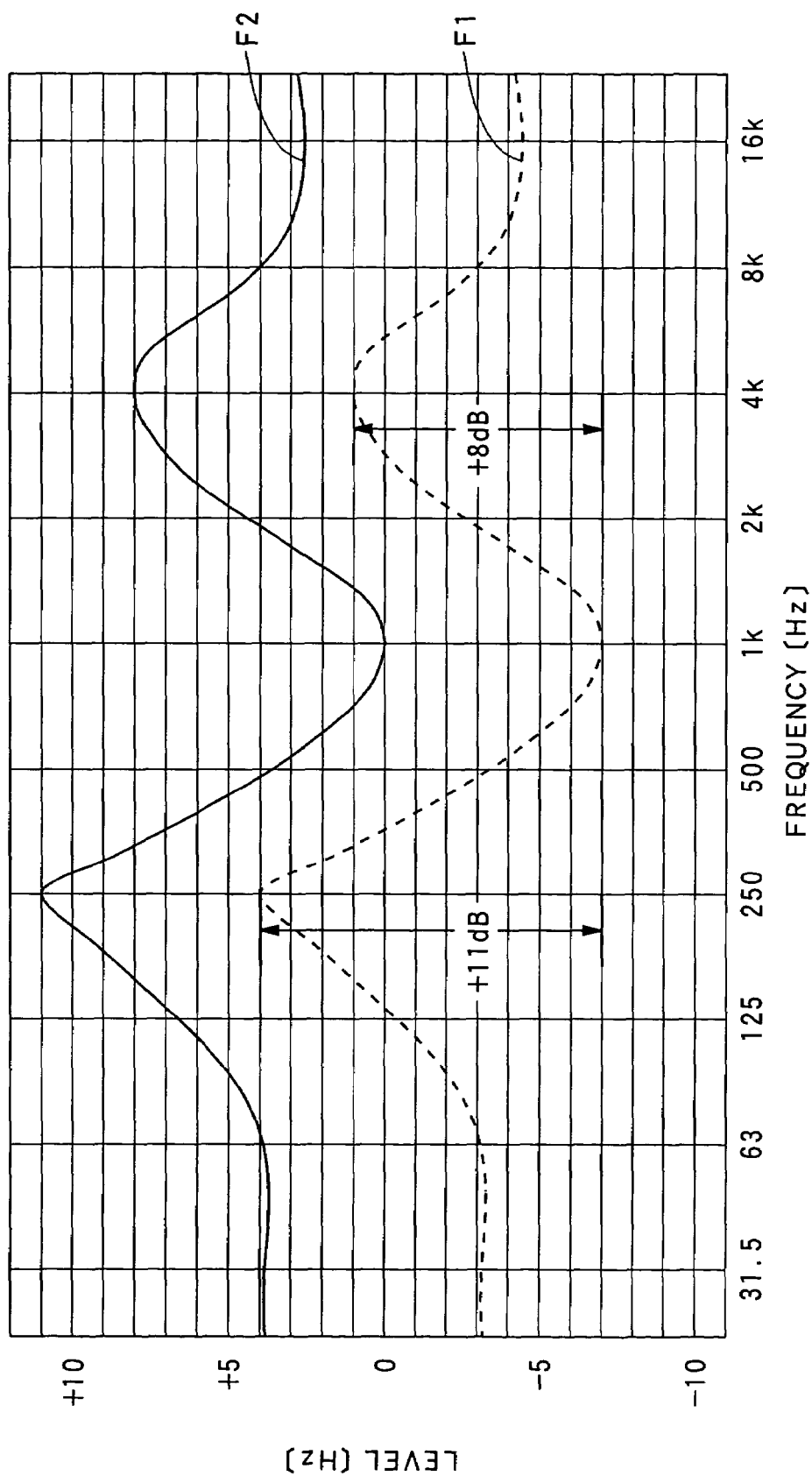
FIG. 1 shows graphs exemplifying both a target frequency characteristic employed in an embodiment of the present invention and a frequency characteristic of a signal set by a frequency characteristic adjustment apparatus according to the embodiment.

Referring to the accompanying drawings, preferred embodiments of the present invention will now be explained.

First Embodiment

First, the configuration of a frequency characteristic adjustment apparatus according to a first embodiment of the present invention will now be described.

The frequency characteristic adjustment apparatus according to the first embodiment is a device that has the capability of controlling the frequency characteristic of an audio signal so that the frequency characteristic agrees with a target frequency characteristic. In the present embodiment, by way of example, the frequency characteristic adjustment apparatus is composed of a graphic equalizer that divides an audio signal into signal components falling into a plurality of frequency bands and a signal level of each frequency band is enhanced (boosted) or attenuated (cut) so that the frequency characteristic of the audio signal is changed.

The frequency characteristic adjustment apparatus according to the present embodiment can be applied to an analog signal or a digital signal, and not limited to the fact that a signal is applied to which type; that is, the frequency characteristic adjustment apparatus can be applied to any type of signals, such as audio signal, animation signal, static image signal, communication signal, as long as frequency components from lower one to higher one are included in the signal.

In the present embodiment, the frequency characteristic adjustment apparatus is not limited to be applied to the graphic equalizer, but may be practiced into a parametric equalizer having a plurality of frequency bands.

The frequency characteristic adjustment apparatus according to the present embodiment is able to control the frequency components of an inputted audio signal so that the inputted signal becomes equal to a target frequency characteristic. Precisely, this frequency characteristic adjustment apparatus divides an audio signal into signal components in a plurality of frequency bands, and enhances or attenuates a level of the signal component in each of the frequency bands (except its fixed-level band) in such a manner that the level becomes equal to a level of each band of the target frequency characteristic.

The target frequency characteristic, which is previously set in the frequency characteristic adjustment apparatus, is intended to be given to an audio signal to be processed by the frequency characteristic adjustment apparatus.

For instance, in cases where the frequency characteristic adjustment apparatus is a manually-operated graphic equalizer, the target frequency characteristic can be adjusted and set by a user who operates volumes for adjusting levels in a plurality of frequency bands, the volumes being disposed on an operation panel of the graphic equalizer.

Alternatively, in cases where the frequency characteristic adjustment apparatus is an automatic graphic equalizer incorporated in an automatic sound-field correction system, the target frequency characteristic can be given automatically through automatic detection or automatic calculation carried out in the automatic sound-field correction system.

Still alternatively, the target frequency characteristic of this frequency characteristic adjustment apparatus may be provided from an external audio device or a computer placed outside this apparatus. Further, by way of example, it may be possible to provide the configuration in which such a target frequency characteristic can be given to the frequency characteristic adjustment apparatus in response to a command from an externally placed audio device or computer.

In the present embodiment, the frequency characteristic adjustment apparatus comprises reception means configured to receive an audio signal given from outside the apparatus; estimation means configured to divide signal components at frequencies of the audio signal received by the reception means into a one fixed-level band and one or more variable-level bands and to estimate a relative level of the signal component in each variable-level band on the basis of a level of the signal component in the fixed-level band in the target frequency characteristic; adjustment means configured to adjust a level of the signal component of each variable-level band so that the level is enhanced or attenuated; and output means configured to output the audio signal subjected to the enhancement or attenuation of the level of the signal component in each variable-level band.

The estimation means is configured to divide signal components at frequencies of the audio signal received by the reception means into a plurality of frequency bands, and select one of the frequency bands as the fixed-level band and the rest of the frequency bands as the variable-level bands.

By way of example, the estimation means employs either one of means in which a plurality of band-pass filters of which central frequencies are different from each other are inserted in series in a path of the audio signal or means in which a path of the audio signal is branched into a plurality of paths in which band-pass filters of which central frequencies are different from each other are inserted, respectively. Thus, the audio signal is divided into a plurality of frequency bands.

Alternatively, how to divide the audio signal into plural frequency bands is not limited to the above, but other known means can also be adopted.

The estimation means is configured to estimate a relative level of a signal component in each variable-level band on the basis of a signal component in the fixed-level band of the target frequency characteristic.

As an example, the estimation means has a memory circuit to memorize a level of a signal component in each frequency band of the target frequency characteristic and a calculation circuit to execute an estimation processing program with reference to each level memorized in the memory circuit. Hence on the basis of the signal component level in the fixed-level band of the target frequency characteristic, a relative level of each signal component in each variable-level band can be estimated.

The estimation processing program executed by the calculation circuit is configured to have the capability of estimating a relative level of each signal component in each variable-level band on the basis of the signal component level in the fixed-level band of the target frequency characteristic.

The adjustment means enhances or attenuates a level of each signal component in each variable-level band of the audio signal, on the basis of the relative level of each signal component in each variable-level band, which is estimated by the estimation means. For instance, the adjustment means can be accomplished with amplification and attenuation means for amplifying and attenuating signal components in the variable-level bands.

In the present embodiment, means for dividing an audio signal and means for amplifying and attenuating the signal components may be formed on analogue circuits or digital circuits.

In addition, the adjustment means is entitled to adjust a level of a signal component in each variable band, but not to adjust that in the fixed-level band.

The output means is configured to output, from the apparatus, the audio signal of which signal components in the variable-level bands have been enhanced or attenuated.

Accordingly, by the frequency characteristic adjustment apparatus according to the present embodiment, the signal components in the variable-level bands can be adjusted in their levels in a controlled manner, while the signal component in the fixed-level band is kept without being adjusted, thus being kept the same level.

Referring to FIG. 1, the operations of the frequency characteristic adjustment apparatus according to the present embodiment will now be described.

FIG. 1 shows two frequency characteristic curves consisting of a target frequency characteristic noted by a reference "F1" and a frequency characteristic of an audio signal, which is noted by another reference "F2," of which signal component levels at each frequency are adjusted by the frequency characteristic adjustment apparatus.

In the present embodiment, by way of example, the frequency components of an audio signal is divided into ten frequency bands each of which central frequencies are 31.5 Hz, 63 Hz, 125 Hz, 250 Hz, 500 Hz, 1 kHz, 2 kHz, 4 kHz, 8 kHz, and 16 kHz. Among those ten frequency bands, a frequency band of which central frequency is 1 kHz is designated as a "fixed-level band," while the remaining frequency bands are designated as "variable-level bands."

The estimation means relatively estimates a level of a signal component in each of the variable-level bands on the basis of a level of a signal component in the fixed-level band of the target frequency characteristic F1.

For instance, when taking a level of the signal component at a frequency of 1 kHz in the target frequency characteristic F1, the estimation means estimates the signal component at a frequency of 250 Hz as a relative level of +1 dB, at a frequency of 4 kHz as a relative level of +8 dB, respectively.

On the basis of the relative levels of the individual variable band estimated by the estimation means, the adjusting means adjusts levels of the signal components in the variable-level bands of the audio signal so that their levels are enhanced or attenuated. For example, an assumption can be made such that an arbitrary audio signal is inputted into the frequency characteristic adjustment apparatus and the original frequency characteristic of the audio signal shows 0 dB in the level of a signal component in each of the plural bands of its frequency characteristic. In this case, because the target frequency characteristic has a relative signal component level of +11 dB at its frequency 250 Hz and a relative signal component level of +8 dB at its 4 kHz, the adjusting means adjusts the inputted audio signal so that a relative level of a signal component at a frequency of 250 Hz becomes +11 dB and a relative level of a signal component at a frequency of 4 kHz becomes +8 dB.

As a result, the frequency characteristic of the frequency-characteristic-adjusted audio signal expresses the same frequency characteristic as the curve F2 shown in FIG. 1.

As understood from FIG. 1, this frequency characteristic F2 changes in the same way as the target frequency characteristic F1 as their frequencies change, except that the entire level of the frequency characteristic F2 differs from that of the target frequency characteristic F1. Signal component levels in the variable-level bands assigned to the frequency characteristic F2 of the audio signal are enhanced depending on a relative difference between each of the signal components in the variable-level bands and the signal component (i.e. reference signal component) in the fixed-level band of the target frequency characteristic F1, while still keeping the signal component level in the fixed-level band to 0 dB, without changes, as provided in the original form of the audio signal.

Accordingly, the frequency characteristic adjustment apparatus according to the present embodiment is capable of estimating relative signal component levels in the variable-level bands assigned to an audio signal on the basis of a signal component level in the fixed-level band of a target frequency characteristic, and adjusting the audio signal so that signal component levels in the variable-level bands of the audio signal are enhanced or attenuated selectively depending on the relative signal components levels in the variable-level bands.

It is therefore possible that, with no changes given to a signal component level in the fixed-level band (that is, without being enhance or attenuated), the frequency characteristic of an audio signal to be processed agrees with a target frequency characteristic.

Still the present embodiment has no necessity of arranging means for enhancing or attenuating a signal component level in the fixed-level band and is able to reduce the band level adjusting means by one, without the number of bands (i.e., the number of divided frequency bands)

For example, in the case that, as shown in FIG. 1, an audio signal is divided into the ten frequency bands for adjustment of its signal component levels, the level adjusting mechanism is not required as for the frequency band of which center frequency is 1 kHz (that is, the fixed-level band). It is therefore sufficient that the nine variable-level bands have their own level adjusting mechanisms, namely, nine level adjusting mechanisms in total.

Accordingly, in the present embodiment, without lowering frequency resolution (i.e., accuracy in adjusting frequency characteristics), cost for manufacturing the frequency characteristic adjustment apparatus can be reduced or avoided from increasing.

Various modes that can be reduced into practice in the present embodiment will now be explained.

As described above, the frequency characteristic adjustment apparatus according to the present embodiment has been configured so that the frequency characteristics of an audio signal are divided into one fixed-level band and one or more variable-level bands and the central frequency in the fixed-level band and bandwidth thereof are arbitrarily set. But this configuration can be modified into various other forms. For example, the fixed-level band can be placed at an arbitrary frequency band range at which the human is sensitive to changes in the sound pressure level.

If such a configuration is adopted, the adjustment of frequency characteristic of an audio signal by the frequency characteristic adjustment apparatus according to the present embodiment is possible to prevent the sound pressure level in audibility from being changed largely.

Normally, the human audibility changes depending audio frequencies, so that if audio signals are the same in their sound pressure levels but different in frequencies from each other, the human has different sound feelings. Changes in the sound pressure level on the audibility of the human depend on sound frequencies.

In other words, there are a frequency band in which the human audibility is relatively higher in sensitivity to changes in the sound pressure level and other frequency bands in which the human audibility is relatively lower in such audibility. Because of this, designating as the fixed-level band a frequency band that allows the human to have a higher sensitivity to change in the sound pressure level (for example, a human's dominant frequency band in sensing changes in the sound pressure level), a signal component level in the fixed-level band will not be subjected to changes, when compared before and after the processing carried out by the frequency characteristic adjustment apparatus, as shown in the frequency characteristic F2 in FIG. 1.

Accordingly, there are little changes in the sound pressure level of an audio signal on the audibility when compared before and after being subjected to the processing carried out by the frequency characteristic adjustment apparatus.

Further, in the present embodiment, as stated above, changes in the frequency characteristic of an audio signal by the frequency characteristic adjustment apparatus will not cause larger changes in the sound pressure level of the audio signal on the audibility. Fluctuations in the sound pressure level, which is attributable to the processing itself carried out by the frequency characteristic adjustment apparatus can be absorbed and amounts of the sound pressure level which must be amplified or attenuated after the processing can be lessened. This means that amounts of noise finally outputted can be reduced.

To be specific, in cases where a digital audio signal which has been subjected to the frequency characteristic adjustment according to the present embodiment is digital-analog converted and then amplified, amounts of to be amplified by the amplifier arranged after the frequency characteristic adjustment apparatus become less, due to the fact that the frequency characteristic adjustment will not reduce the sound pressure level of the audio signal largely.

Therefore, even when there is noise mixed into the audio signal during the digital-analog conversion thereof, it can be avoided that the noise mixed with the audio signal is amplified together with the amplification of the audio signal.

In the present embodiment, it is preferred that the fixed-level band is set to a predetermined frequency band including a frequency of 1 kHz.

Figure 2:
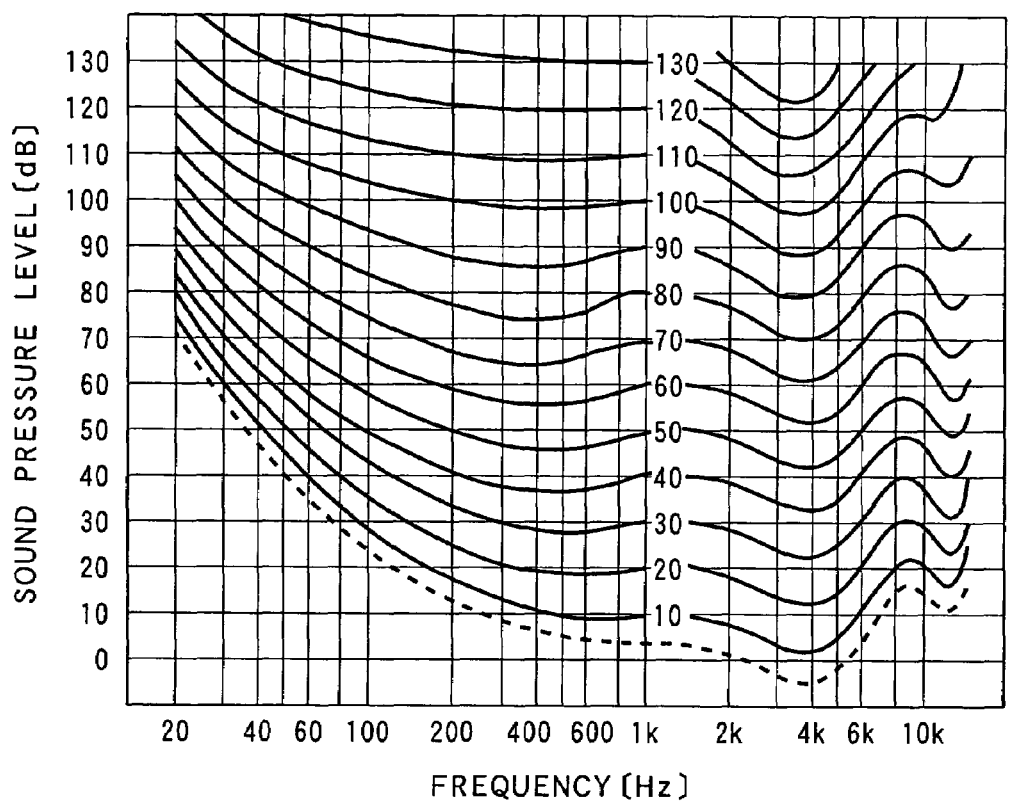
FIG. 2 shows graphs exemplifying equal loudness curves.

In general, it is understood that the sound pressure level on the audibility changes largely in a frequency band at around 1 kHz. For instance, as shown in FIG. 2, the sound pressure level at around 1 kHz is larger than the sound pressure levels at around 600 Hz and 4 kHz. This reveals that the sound pressure level on the audibility in a frequency band including around 1 kHz changes in a larger manner than that in the other frequency bands.

Thus, when the frequency characteristic of an audio signal is adjusted by the frequency characteristic adjustment apparatus according to the present embodiment, the sound pressure level on the audibility of the audio signal can be avoided from changing largely, and noise can be suppressed, because amounts of the audio signal, which must be amplified after the frequency characteristic adjustment, can be reduced, as described above.

FIG. 2 shows equal loudness curves expressing the audible ranges of the human, in which the sound pressure levels of sounds that can be heard in the same level as a pure sound of 1 kHz are connected to with each other.

Still, in the present embodiment, it is also preferred that the fixed-level band is set to a predetermined band including 500 Hz to 2 kHz. This also provides the similar advantages the configuration in which the fixed-level band is set to a predetermined frequency band including a frequency of 1 kHz.

To be specific, it is generalized that a frequency band from 500 Hz to 2 kHz shows larger changes in the sound pressure level of audio signals on the audibility.

For instance, this generalization is used for a noise meter that has the capability of determining whether sound is larger or smaller in a physical and feeling view point and quantifying the sound. The noise meter corrects a sound pressure level based on a frequency characteristic imitating a human audibility feeling, and adopts the correct sound pressure level as a noise level. As a result, the noise meter provides a frequency band in which changes in the sound pressure level on the human audibility appear in a larger manner.

Figure 3:
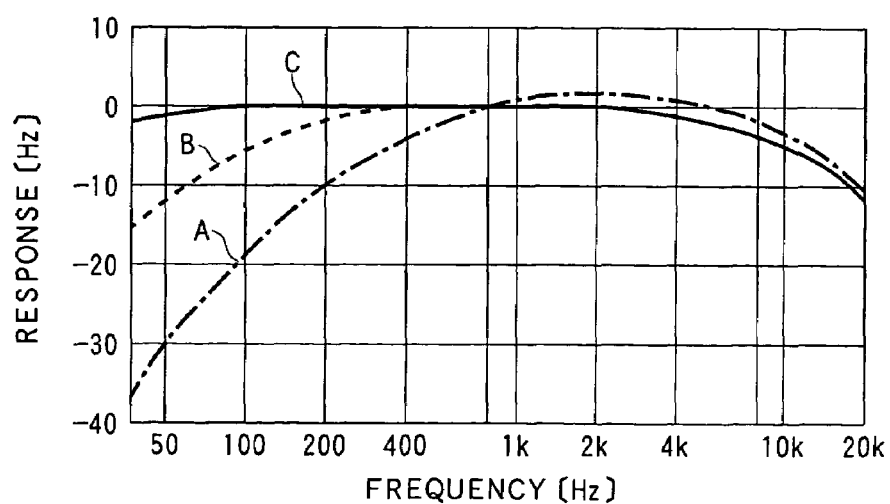
FIG. 3 shows graphs exemplifying frequency correction characteristics used by a noise meter.

As shown in FIG. 3, it is possible to find that any curve shows larger amounts of changes in the sound pressure level on the audibility in the band from 500 Hz to 2 kHz. Hence the foregoing frequency correction characteristic makes it possible to provide a frequency band in which larger changes in the sound pressure level on the human audibility appear.

FIG. 3 shows three frequency correction curves A to C based on the standards of IEC (International Electrotechnical Communication), any curve expressing larger amounts of changes in the sound pressure level on the audibility in a frequency band from 500 Hz to 2 kHz.

In the present embodiment, designating as the fixed-level band a particular frequency band included in the band from 500 Hz to 2 kHz provides the similar or identical advantages to the above.

Still, in the frequency characteristic adjustment apparatus according to the present embodiment, there may be provided level adjusting means for adjusting signal levels from the output means in such a manner that an audio signal received by the reception means and the audio signal outputted from the output means are made to be equal in the level to each other.

This configuration makes it possible that an audio signal appearing at the output end of the frequency characteristic adjustment apparatus under its off-state and that appearing at the output end of the frequency characteristic adjustment apparatus under its on-state are equal in the their levels to each other. Thus, the levels of audio signals at the output end of the frequency characteristic adjustment apparatus can be avoided from being changed depending on whether the apparatus is in its on- or off-state.

Still, in the frequency characteristic adjustment apparatus according to the first embodiment, there may be provided measuring-signal generation means for outputting to the reception means a measuring signal having a predetermined frequency band in which the human is sensitive to changes in the sound pressure level on the audibility.

If such a configuration is provided in the frequency characteristic adjustment apparatus, the measuring signal outputted from the measuring-signal generation means is subject to the processing at each means in the apparatus, before being sent to the output means. As a result, the mutual comparison made between the levels of the measuring signals to be received by the reception means and to be outputted from the output means supplies a changed amount between the levels of audio signals appearing at the output end of the frequency characteristic adjustment apparatus when the apparatus is turned on and off.

Hence when a manually operated amplifier or attenuator is arranged on the output side of the frequency characteristic adjustment apparatus, a user is allowed to manually operate the amplifier or attenuator to equalize the levels of the measuring signals appearing at the output end of the frequency characteristic adjustment apparatus when the apparatus is turned on and off.

The foregoing measuring-signal generation means can be added to the frequency characteristic adjustment apparatus with the level adjusting means, with the result that the level adjustment using the measuring signal can be executed in an automatic fashion.

Moreover, when the frequency of the measuring signal is set to a predetermined frequency band which is sensitive to the human in terms of changes in the sound pressure level on the audibility, audio signals appearing at the output end of the frequency characteristic adjustment apparatus in response to turning on and off the apparatus can be prevented from being changed in their sound pressure level on the audibility.

The frequency characteristic adjustment apparatus according to the present embodiment may be configured into an apparatus dedicated to the adjustment processing, which can be integrated with other hardware systems, or may be realized with a computer in which a program for the various functions is installed.

Second Embodiment

A second embodiment of the present invention will now be described.

A frequency characteristic adjustment apparatus according to the second embodiment comprises reception means configured to receive an audio signal given from outside the apparatus; adjustment means configured to divide signal components at frequencies of the audio signal received by the reception means into a one fixed-level band and to enhance or attenuate a level of the signal component in only each variable-level band; and output means configured to output signal components each of which levels has been enhanced or attenuated in each variable-level band.

In this apparatus, the fixed-level band is set to a predetermined frequency band at which the human is sensitive to changes in the sound pressure level on the audibility.

In the apparatus according to the present embodiment, the adjustment means adjusts only the signal components in the variable-level bands can be enhanced or attenuated in their levels, but does not adjust that in the fixed-level band. Hence, an original level of the signal component level in the fixed-level band is kept without being adjusted. Even in this configuration where there is no means for adjusting a signal component level in the fixed-level band, signal components levels in the variable-level bands can be adjusted, whereby the signal components level in the variable-level bands can be adjusted relatively on the basis of that in the fixed-level band. This makes it possible to give desired characteristics to all the frequency bands of an audio signal.

Because setting desired characteristics can be done without enhancing or attenuating the signal component level in the fixed-level band, it is not required to have means for such adjustment for the fixed-level band. Accordingly, with no reduction in the number of bands (that is, the number of divisions of frequency bands), the adjustment mechanisms for the signal components levels in all the bands can be reduced by one.

It is therefore possible that resolution in frequency, which will lead to accuracy in frequency characteristic adjustment, can be sustained or improved, while still reducing or suppressing cost for manufacturing the frequency characteristic adjustment apparatus.

Furthermore, in the frequency characteristic adjustment apparatus according to the second embodiment, the fixed-level band is still given in a predetermined frequency band which allows the human to sense changes in the sound pressure level on the audibility. As a result, when the frequency characteristic of an audio signal by the frequency characteristic adjustment apparatus is adjusted, the sound level on the audibility of the audio signal can be avoided from being changed largely, thus providing the similar or identical advantages to those in the above-said various modes of the frequency characteristic adjustment apparatus according to the first embodiment.

Incidentally, like the first embodiment, the frequency characteristic adjustment apparatus according to the present embodiment may be configured into an apparatus dedicated to the adjustment processing, which can be integrated with other hardware systems, or may be realized with a computer in which a program for the various functions is installed.

Third Embodiment

Referring to the accompanying drawings, a third embodiment of a frequency characteristic adjustment apparatus according to the present invention will now be described. The frequency characteristic adjustment apparatus is applied to a multi-channel amplifying unit contained into a multi-channel audio system.

Figure 4:
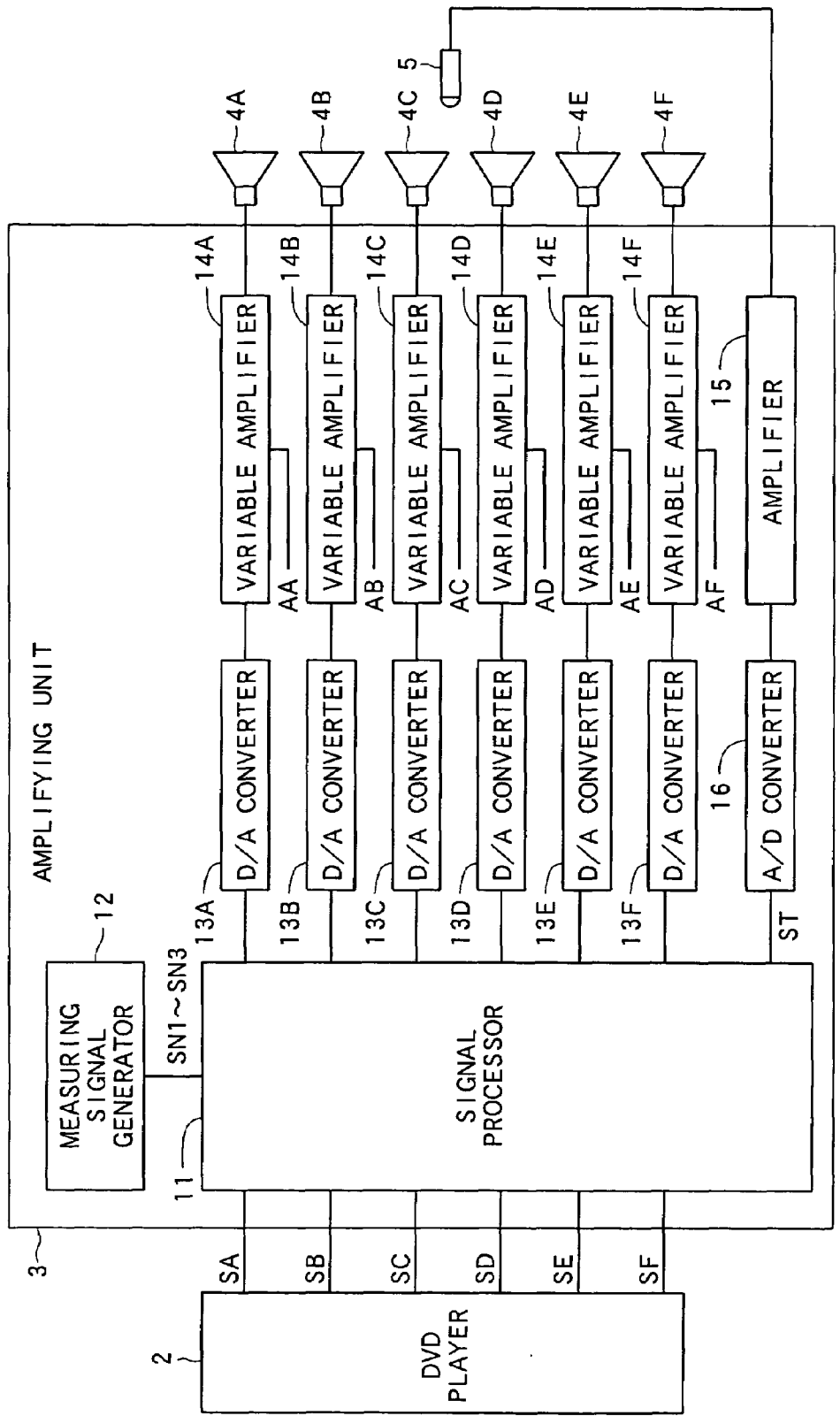
FIG. 4 is a block diagram showing the configuration of a multi-channel audio system according to an embodiment of the present invention, the system including an amplifying unit.
Figure 5:
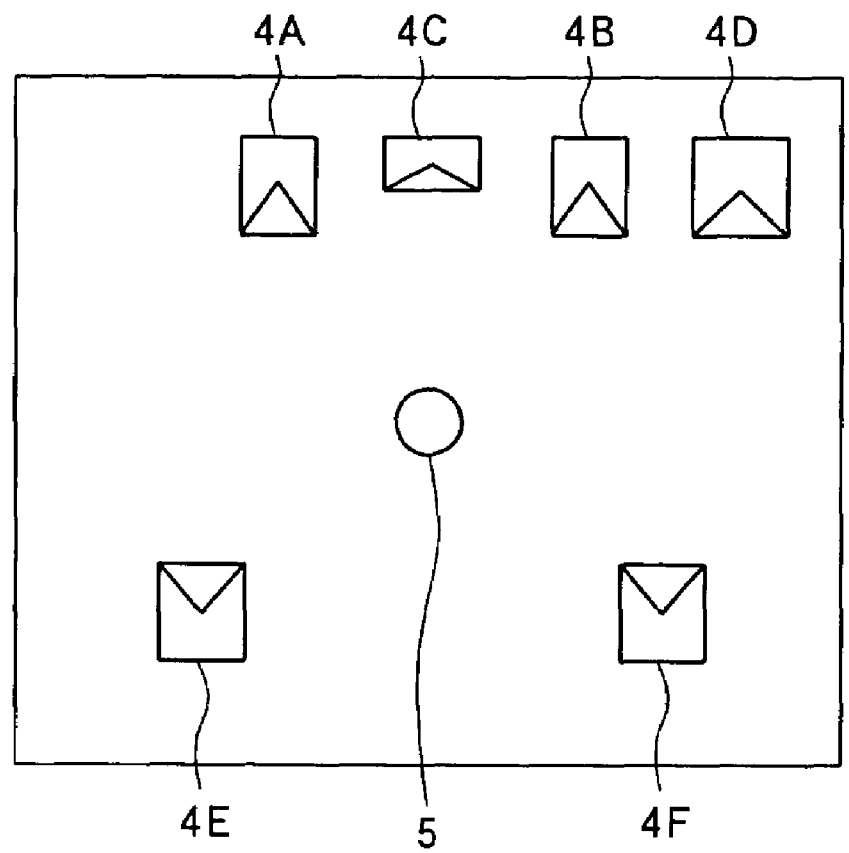
FIG. 5 illustrates the positions of speakers and microphones of the multi-channel audio system according to the embodiment.

Referring to FIGS. 4 and 5, the configuration of a multi-channel audio system will now be described.

FIG. 4 is a block diagram showing both of the configurations of the multi-channel audio system and an amplifying unit, while FIG. 5 is a diagram which illustrates the positions of speakers and microphones of the multi-channel audio system.

A multi-channel audio system 1 shown in FIG. 4 is an audio system which is able to actualize a multi-channel reproduction in, for example, 5.1 ch surround-sound. As shown in FIG. 4, the multi-channel audio system 1 is composed of a DVD player 2, an amplifying unit 3, speakers 4A to 4F, of which number is six as an example, and a microphone 5.

The DVD player 2 is an information reproduction apparatus to reproduce audio data recorded on a DVD and to output audio signals SA to SF indicative of the audio data.

Because being compliant with the multi-channel reproduction, the DVD player 2 outputs audio signals of by way of example six channels of SA to SF, if audio data compliant with the multi-channel reproduction are recorded on a DVD.

The DVD player 2 of the present embodiment outputs digital audio signal SA to SF, though both analog and digital signals are feasible as signals outputted from the DVD player 2.

The amplifying unit 3 is an audio-output control apparatus compliant with multi-channels. The amplifying unit 3 receives the 6-channel audio signals SA to SF outputted from the DVD player 2, adjusts frequency characteristics, delay times, sound pressure levels, and others of these audio signals SA to SF, and distributes the audio signals SA to SF to six speakers 4A to 4F, channel by channel.

Moreover, the amplifying unit 3 has a function to perform automatic sound-field correction. The function of the automatic sound-field correction is for automatically setting (controlling) frequency characteristics, delay times, and sound pressure levels of the audio signals SA to SF channel by channel.

The six speakers 4A to 4F and the microphone 5 are connected to the amplifying unit 3.

Each of the speakers 4A to 4F is connected to the amplifying unit 3, in concrete terms, the six speakers are composed of a left front speaker 4A, a right front speaker 4B, a center speaker 4C, a subwoofer 4D, a left rear speaker 4E, and a right rear speaker 4F.

These speakers 4A to 4F are located in position as shown in FIG. 5 to actualize the surround-sound reproduction.

FIG. 4 shows that the microphone 5 is connected to the amplifying unit 3. The microphone 5 is used when the amplifying unit 3 executes the automatic sound-field correction.

The microphone 5 is located, as shown in FIG. 5, at the center of the area where the speakers 4A to 4F are placed, in cases where the automatic sound-field correction is executed.

Next, the configuration of the amplifying unit 3 of the present embodiment will now be described referring to FIG. 4.

The amplifying unit 3 is, as shown in FIG. 4, provided with a signal processor 11, a measuring-signal generator 12, six D/A (digital to analog) converters 13A to 13F, six variable amplifiers 14A to 14F, an amplifier 15, and an A/D (analog to digital) converter 16.

The signal processor 11 performs the tasks of setting and adjusting the frequency characteristics, delay times, and sound pressure levels of the audio signals SA to SF inputted into the amplifying unit 3 from the DVD player 2.

The configuration of the signal processor 11 of the present invention will be detailed later.

The measuring-signal generator 12 is placed for use in performing the automatic sound-field correction. To be specific, in performing the automatic sound-field correction, the measuring-signal generator 12 will produce measuring signals SN1 to SN3 to be supplied to the signal processor 11. The measuring signals SN1 to SN3 is formed of pink noise, for example.

The D/A converters 13A to 13F are in charge of digital-to-analog conversion of audio signals SA to SF (digital-form signals) supplied from the signal processor 11, respectively, thus analog signals of the audio signals SA to SF being outputted.

The variable amplifiers 14A to 14F are placed to amplify the audio signals SA to SF from the D/A converters 13A to 13F. A gain of each of the amplifiers 14A to 14F is configured to be controlled in response to each of amplification control signals AA to AF which are supplied respectively from an amplification controller 73 arranged in a controller 22 in the signal processor 11.

The amplifier 15 is responsible for amplification of a collected signal from the microphone 5 in performing the automatic sound-field correction.

Further, the A/D converter 16 will perform analog-to-digital conversion on the collected signal amplified at the amplifier 15 in performing the automatic sound-field correction, and then provide the signal processor 11 with the amplified digital-form collected signal ST.

Figure 6:
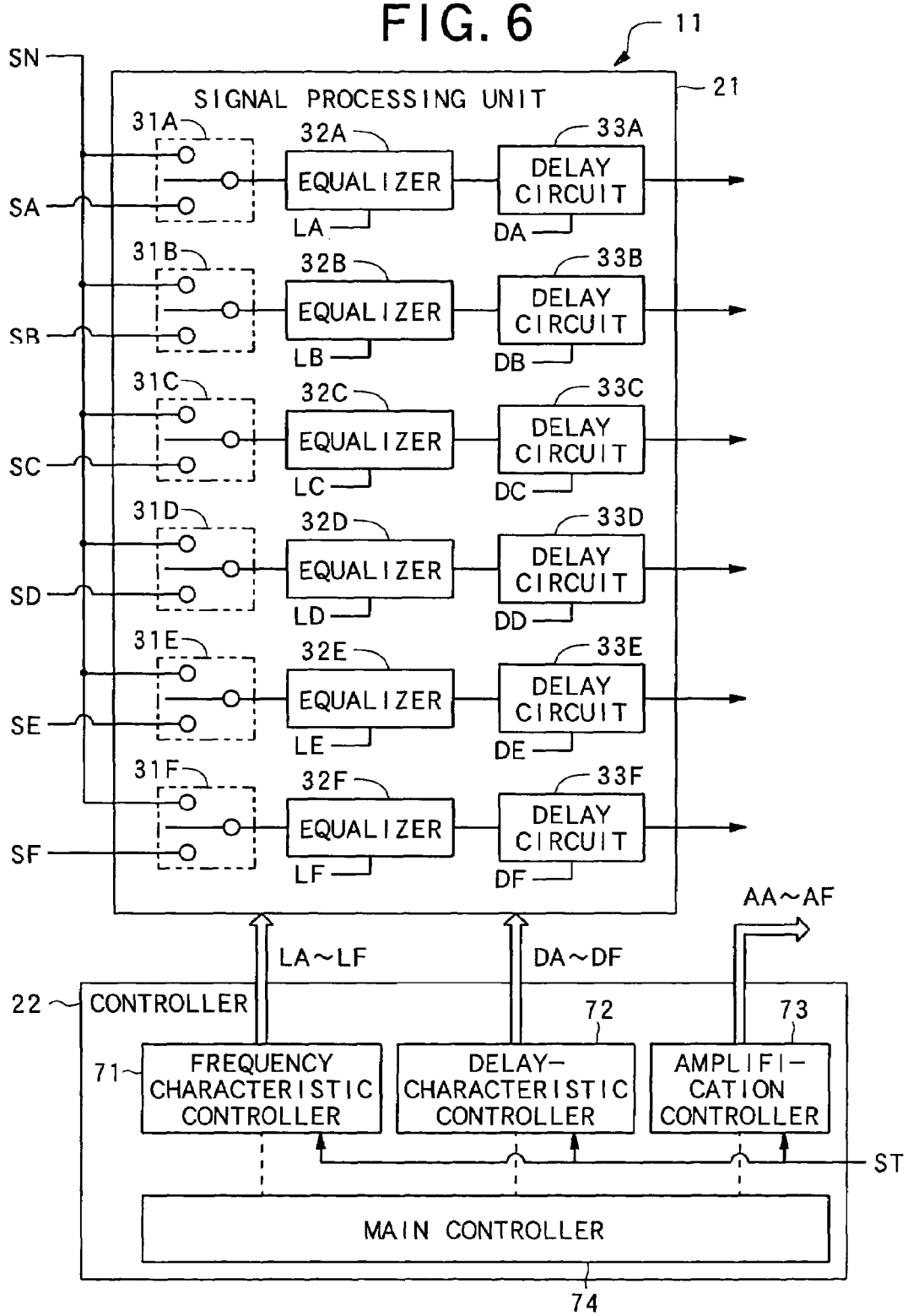
FIG. 6 is a block diagram showing the configuration of a signal processor according to the embodiment.

In connection with FIG. 6, the configuration of the signal processor 11 will now be described. FIG. 6 shows in a block form the signal processor 11.

As shown in FIG. 6, the signal processor 11 has a signal processing unit 21 and a controller 22.

Of these, the signal processing unit 21, which has six switches 31A to 31F each formed into a two-inputs/one-output type, six equalizers 32A to 32F, and six delay circuits 33A to 33F, is in charge of setting and adjusting frequency characteristics and delay characteristics of the audio signals SA to SF coming from the DVD player 2.

The switches 31A to 31F are placed for selection of either the audio signals from the DVD player 2 or the measuring signals SN1 to SN3 from the measuring-signal generator 12, so that signals to be inputted to the signal processing unit 21 are selected.

In cases where the automatic sound-field correction is performed, each of the switches 31A to 31F operates to connect one input terminal (depicted at an upper position in FIG. 6) and the common output terminal in the internal circuit thereof, thus providing the measuring signals SN1 to SN3 to each of the equalizers 32A to 32F.

In contrast, in cases where a DVD is reproduced, each of the switches 31A to 31F operates to connect the other input terminal (depicted at a lower position in FIG. 6) and the common output terminal in the internal circuit thereof, thus providing the audio signals SA to SF to each of the equalizers 32A to 32F, respectively.

The switches 31A to 31F are configured to switch over internally responsively to a command from a main controller 74 placed in the controller 22.

The equalizers 32A to 32F are formed to set (adjust) the frequency characteristics of the audio signals SA to SF, respectively, by operating in response to level control signals LA to LF sent from a frequency characteristic controller 71 placed in the controller 22. The equalizers 32A to 32F will be detailed later as to their configurations.

To the delay circuits 33A to 33F are inputted the audio signals SA to SF coming from the equalizers 32A to 32F, respectively. Each of the equalizers 33A to 33F has the capability of adjusting the delay characteristic of each of the audio signals SA to SF that have been inputted.

The delay circuits 33A to 33F are formed to be controlled by delay control signals DA to DF supplied from a delay controller 72 placed in the controller 22, respectively.

The controller 22 will mainly control each of necessary constituents when the automatic sound-field correction is carried out.

Practically, the controller 22 estimates, in the automatic sound-field correction, frequency characteristics (i.e., levels of signal components in individual bands), delay characteristics (delay amounts), and sound pressure levels (gains) which are all set to the audio signals SA to SF, and controls the equalizers 32A to 32F, delay circuits 33A to 33F, and variable amplifiers 14A to 14F in the signal processing unit 21 on the basis of the estimated results.

The controller 22 is provided, as shown in FIG. 6, the frequency characteristic controller 71, delay controller 72 and amplification controller 73.

The frequency characteristic controller 71 is configured to not only estimate frequency characteristics that should be set to the audio signals SA to SF but also control the equalizers 32A to 32F on the basis of the estimated frequency characteristics. The frequency characteristic controller 71 will also be detailed later.

The delay controller 72 has the configuration of estimating delay characteristics (delay amounts) that should be given to the audio signals SA to SF and of controlling the delay circuits 33A to 33F using the estimated delay characteristics.

Practically, the delay controller 72 uses the collected-sound signal ST to produce delay control signals DA to DF for control of the delay circuits 33A to 33F. The signals DA to DF are sent to the circuits 33A to 33F.

Further, the amplification controller 73 is configured to estimate sound pressure levels (gains) to be set to the video signals SA to SF and to control the variable amplifiers 14A to 14F (refer to FIG. 4) on the basis of the estimated sound pressure levels.

Specifically, the amplification controller 73 uses the sound-colleted signal ST in order to produce amplification control signals AA to AF for control of the variable amplifiers 14A to 14F. The thus-produced signals AA to AF are sent to the variable amplifiers 14A to 14F.

Figure 7:
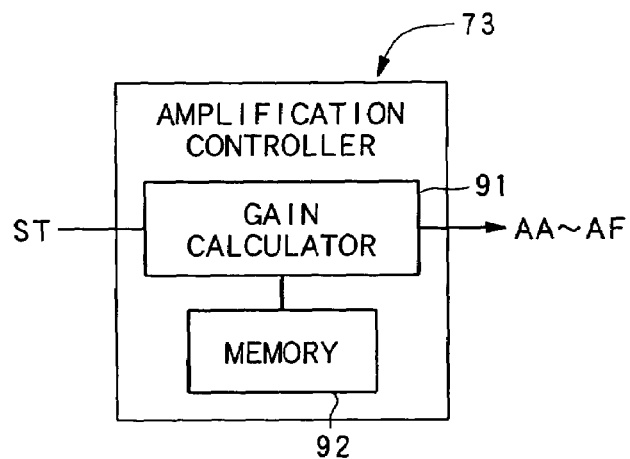
FIG. 7 is a block diagram showing the configuration of an amplification controller according to the embodiment.

As shown in FIG. 7, the amplification controller 73 has a gain calculator 91 made up of a calculating and processing MPU and a memory 92 in which data such as reference levels is stored.

The main controller 74 is also in charge of various types of control, including control of the frequency characteristic controller 71, delay controller 72 and amplification controller 73, and switchover control of the switches 31A to 31F in the signal processing unit 21.

The main controller 74 has a CPU (Central processing unit), ROM (Read-Only Memory), and RAM (Random Access Memory), all of which function as a calculation circuit and storages.

Figure 8:
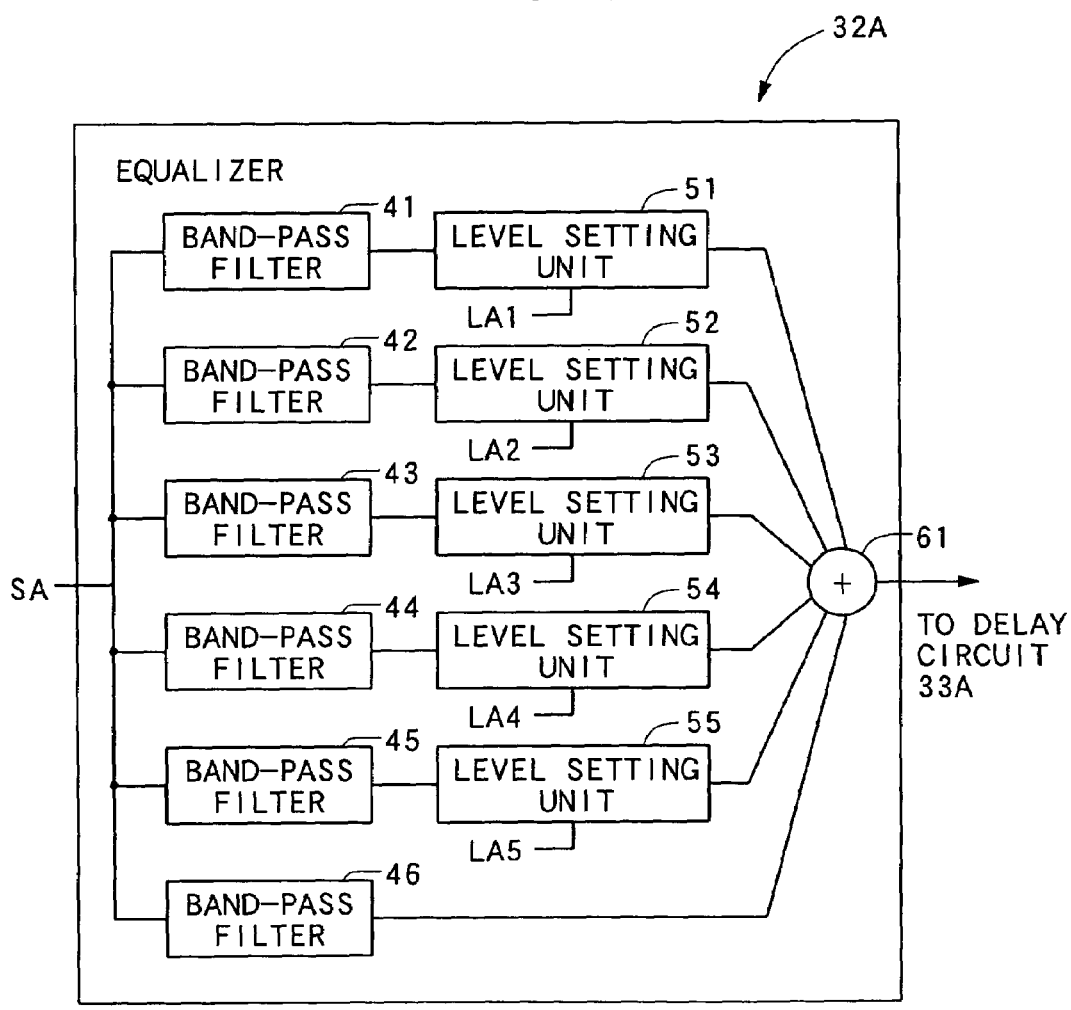
FIG. 8 is a block diagram showing the configuration of an equalizer according to the embodiment.

Referring to FIG. 8, the equalizers 32A to 32F will now be explained in terms of their configurations. FIG. 8 shows a block diagram of one of the six equalizers 32A to 32F, that is, the equalizer 32A. The remaining equalizers 32B to 32F have the same configuration.

As shown in FIG. 8, the equalizer 32A is provided with six band-pass filters 41 to 46 accepting one of the audio signals SA to SF (that is, the audio signal SA), five level setting units 51 to 55 placed immediately after the band-pass filters 41 to 46, and a combiner 62.

In the present embodiment, no level setting device is placed after one of the band-pass filters 41 to 46; that is, the band-pass filter 46 configured to pass signal components falling into a frequency range of 500 Hz to 2 kHz of the audio signal SA. The output of this band-pass filter 46 is directly connected to the combiner 61. Hence, the signal components at frequencies in the range of 500 Hz to 2 kHz of the audio signal SA are directly supplied to the combiner 61 with no changes added to their signal component levels.

Each of the band-pass filters 41 to 46 are configured to pass only signal components at frequencies falling into each of predetermined plural frequency bands formed by dividing the entire frequency band owned by the audio signal SA. The signal components other than those assigned to each frequency band are prohibited from passing the band-pass filter.

To be specific, the band-pass filter 41 is formed to pass only frequency components at 11.3 kHz and thereabouts in the frequencies of the audio signal SA, and the band-pass filter 42 is formed to pass only frequency components at 4 kHz and thereabouts in the frequencies of the audio signal SA.

Furthermore, the band-pass filter 43 is formed to pass only frequency components at 250 Hz and thereabouts in the frequencies of the audio signal SA, while the band-pass filter 43 is formed to pass only frequency components at 125 Hz and thereabouts in the frequencies of the audio signal SA.

The band-pass filter 45 is formed to pass only frequency components at 63 Hz and thereabouts in the frequencies of the audio signal SA, while the band-pass filter 46 is formed to pass only frequency components at 500 Hz to 2 kHz and thereabouts in the frequencies of the audio signal SA, as described before.

The band-pass filters 41 to 45 provide plural variable-level bands, respectively, which are a plurality of frequency bands of which central frequencies are 63 Hz, 125 Hz, 250 Hz, 4 kHz and 11.3 kHz, respectively. In contrast, the remaining band-pass filter 46 provides a fixed-level band of which frequencies range from 500 Hz to 2 kHz.

The level setting units 51 to 55 actually adjust the levels of signal components of the audio signal SA passing the band-pass filters 41 to 45, respectively. Such adjustment is carried out, unit by unit, in response to level control signals LA1 to LA5 outputted from the frequency characteristic controller 71 (the signals LA1 to LA5 are summarized as the level control signal LA).

From a more concrete viewpoint, the level setting units 51 to 55 are able to respond to the level control signals LA1 to LA5 to adjust (set) the levels of signal components of the audio signal SA, respectively.

As shown in FIG. 8, the audio signal SA is divided into a plurality of groups of signal components falling respectively into a plurality of frequency bands by the band-pass filters 41 to 45, and then the divided signal components of the audio signal SA are applied to the level setting units 51 to 55 group by group. Each of the level setting units 51 to 55 changes the levels of the signal components falling into each divided frequency band in response to each of the level control signals LA1 to LA5. The level-changed signal components are gathered to the combiner 61 from all of the level setting units 51 to 55.

The combiner 61 will combines all the signal components outputted from the level setting units 51 to 55 and the band-pass filter 46 with each other into one combined audio signal SA, which is then sent to the delay circuit 33A (refer to FIG. 6).

In the present embodiment, the fixed-level band is assigned to a given frequency band in which changes in sound pressure are sensitive to human audibility, that is, a dominant frequency band in making the human sense changes in the sound pressure.

Figure 9:
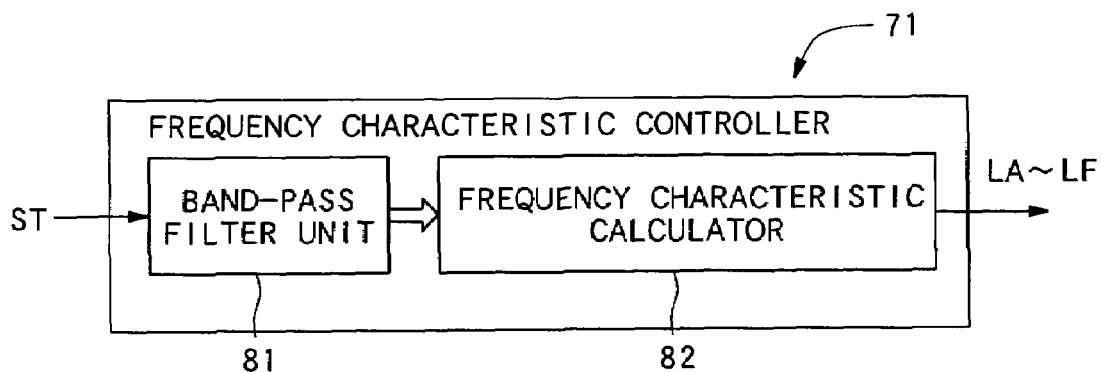
FIG. 9 is a block diagram showing the configuration of a frequency characteristic controller according to the embodiment.

With reference to FIG. 9, the configuration of the frequency characteristic controller 71 will now be described. FIG. 9 shows a block diagram of the frequency characteristic controller 71.

As illustrated in FIG. 9, the frequency characteristic controller 71 is provided with a band-pass filter unit 81 and a frequency characteristic calculator 82 in order to control the equalizers 32A to 32F.

The band-pass filter unit 81 is designed so that the sound-collected signal ST is divided into nine signal components belonging to nine frequency bands. To be specific, when the automatic sound-filed correction is done, the band-pass filter unit 81 receives the sound-collected signal ST (refer to FIG. 4) supplied from the microphone 5 through the amplifier 15 and A/D converter 16 to the signal processor 11.

The band-pass filter unit 81 has nine band-pass filters (not shown) of which central frequencies are 63 Hz, 125 Hz, 250 Hz, 500 Hz, 1 kHz, 2 kHz, 4 KHz, 8 kHz and 16 kHz, respectively. These nine band-pass filters will apply band-pass filtering to the inputted sound-collected signal ST to choose signal components in each frequency band. Thus, through this band-pass filtering, the sound-collected signal ST is divided into signal components falling into the nine frequency bands, which are then sent to the frequency characteristic calculator 82.

The frequency characteristic calculator 82 is provided with elements including an MPU (multi-processing unit) for calculation and processing and memories in which a coefficient table is stored for use processing, so that the frequency characteristic calculator 82 is configured to estimate frequency characteristics that should be set to the audio signals SA to SF.

More concretely, the frequency characteristic calculator 82 uses the signal components of the sound-collected signal ST outputted from the band-pass filter unit 81 in order to produce level control signals LA to LF for control of the equalizers 32A to 32F.

A reproduction operation carried out by the multi-channel audio system 1 will now be described.

As shown in FIG. 1, audio signals SA to SF coming from the DVD player 2 during the reproduction of data on a DVD are sent to the signal processing unit 21 placed in the signal processor 11 in the amplifying unit 3.

Under the reproduction, each of the switches 31A to 31F in the signal processing unit 21 has its inner switchover connections switched to one side connecting one input terminal (lower in FIG. 6) to the common output terminal, so that audio signals SA to SF are supplied to the equalizers 32A to 32F, respectively.

The supplied signals SA to SF are then subjected to adjustment of their frequency characteristics carried out by the equalizers 32A to 32F, and then subjected to adjustment of their delay characteristics carried out by the delay circuits 33A to 33F, respectively.

The delay-controlled audio signals SA to SF are converted to their analog-form signals at the D/A converters 13A to 13F, amplified by the variable amplifiers 14A to 14F, and then sent to the speakers 4A to 4F, respectively (refer to FIG. 4).

Figure 10:
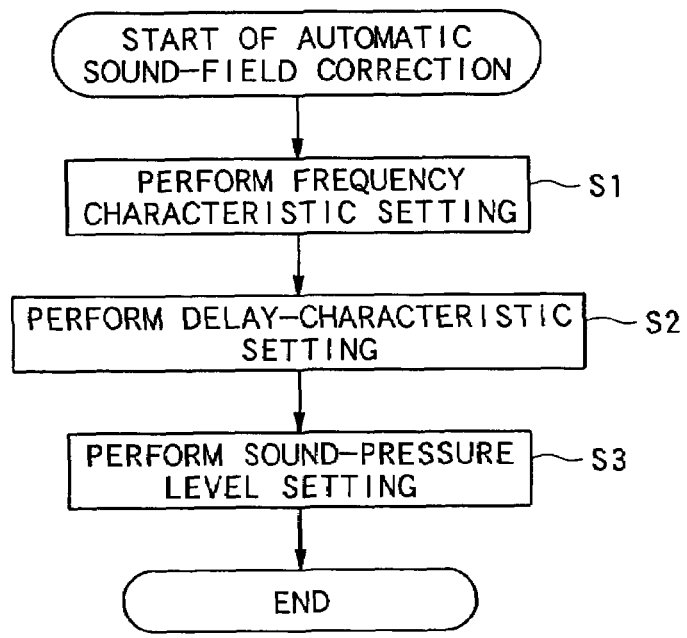
FIG. 10 is a flowchart explaining the main operation for automatic sound-field correction carried out in the embodiment.

Referring to FIG. 10, the automatic sound-field correction performed in the multi-channel audio system 1 will now be described. FIG. 10 shows a flowchart carried out as a main operation for the automatic sound-field correction.

The automatic sound-field correction will be carried out in setting up a new multi-channel audio system 1 or in various preparing steps for reproducing DVDs, such as changes in setting positions of the speakers 4A to 4F.

For instance, in cases where, as shown in FIG. 5, the speakers 4A to 4F are placed in position, the microphone 5 is located in the central region surrounded by the speakers 4A to 4F, and a user instructs the amplifying unit 3 to start the automatic sound-field correction, the amplifying unit 3, which is a key player in the automatic sound-field correction, starts the correction processing.

As shown in FIG. 10, the automatic sound-field correction is carried out in the order of setting of frequency characteristics (step S1), setting of delay characteristics (step S2), to setting of sound pressure levels (step S3).

Figure 11:
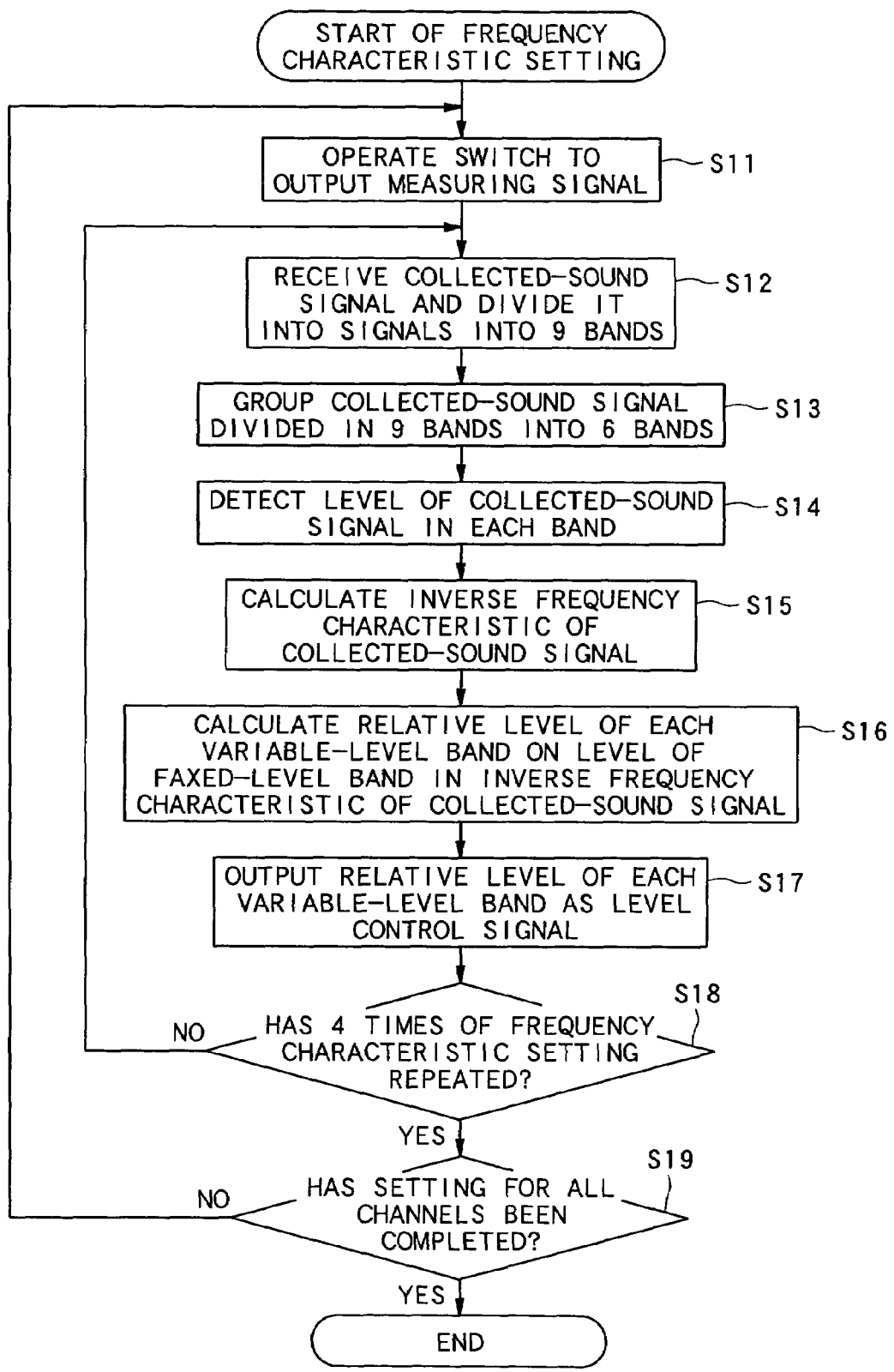
FIG. 11 is a flowchart explaining frequency characteristic setting carried out as part of the automatic sound-field correction in the embodiment.
Figure 12:
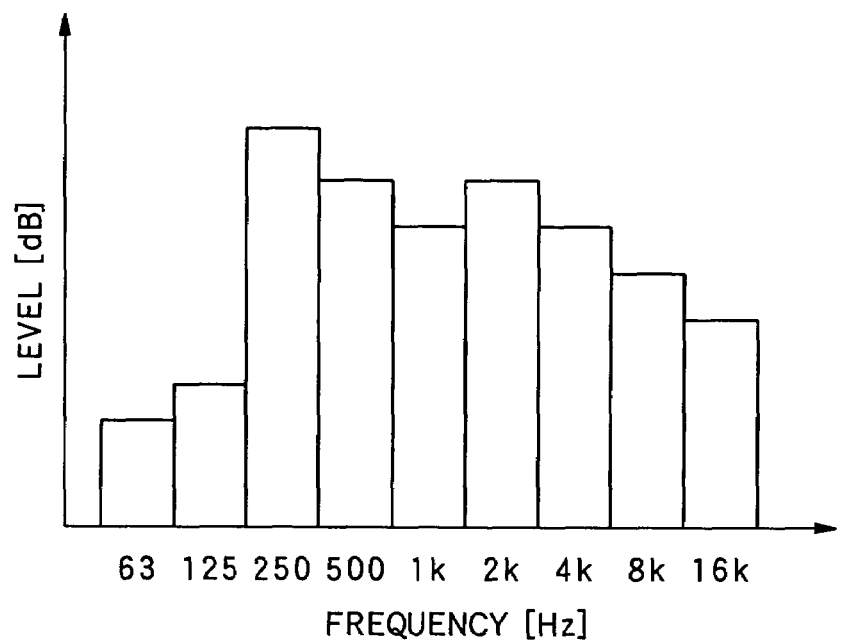
FIG. 12 is a chart representing a frequency characteristic of a collected sound signal processed during the frequency characteristic setting.
Figure 13:
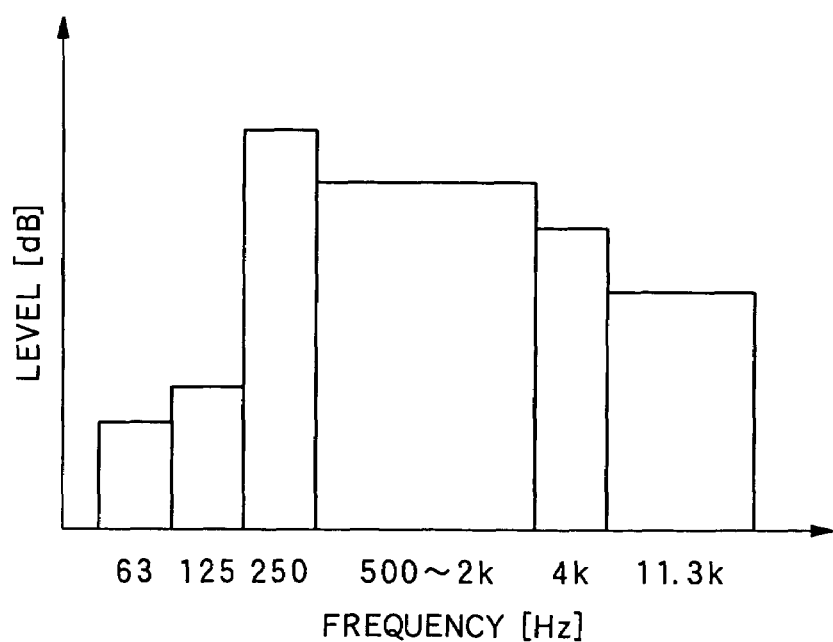
FIG. 13 is a chart representing a frequency characteristic of a collected sound signal processed during the frequency characteristic setting, the collected sound signal being grouped.
Figure 14:
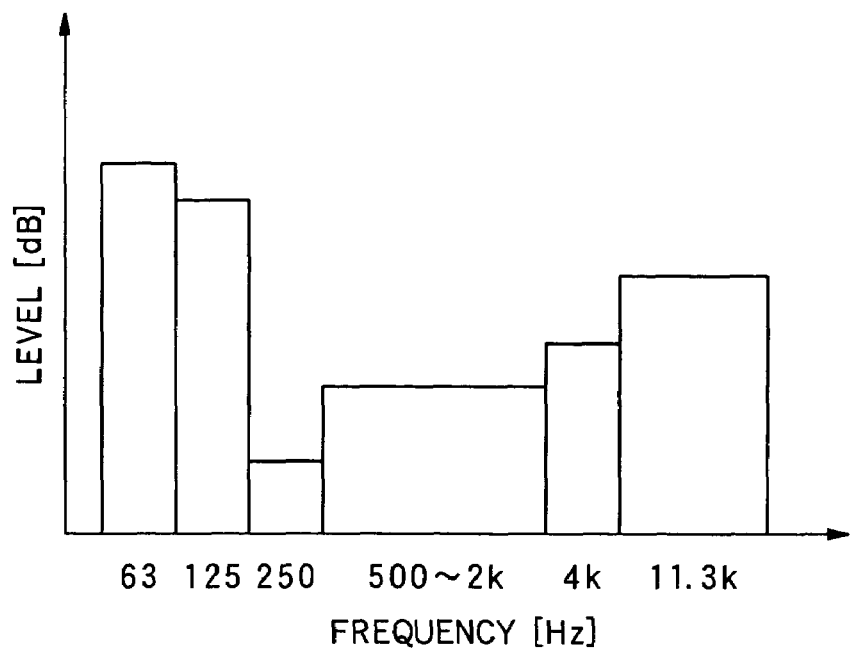
FIG. 14 is a chart representing an inverse frequency characteristic of a collected sound signal processed during the frequency characteristic setting.
Figure 15:
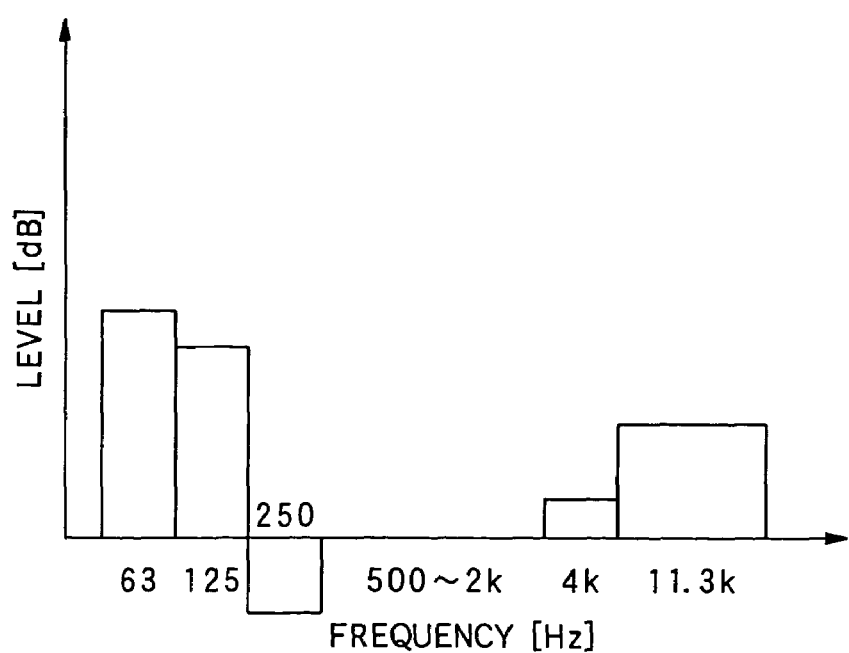
FIG. 15 is a chart representing a frequency characteristic (i.e., a level of each band) that should be given to the equalizer through an offset operation during the frequency characteristic setting.

First, the frequency characteristic setting will now be described with reference to FIGS. 11 to 15, in which FIG. 11 is a flowchart showing the procedures of setting operation frequency characteristics required for the automatic sound-field correction; FIG. 12 exemplifies a frequency characteristic of the sound-collected signal ST of which entire frequency range are divided into nine bands; FIG. 13 exemplifies a frequency characteristic of the sound-collected signal ST of which frequency bands are grouped into six bands; FIG. 14 shows an inverse frequency characteristic of a collected-sound signal ST calculated in the frequency characteristic calculator 82; and FIG. 15 shows a relative frequency characteristic calculated in the frequency characteristic calculator 82.

The frequency characteristic setting is directed to setting of the levels of signal components processed by each of the equalizers 32A to 32F in the signal processing unit 21.

In the present embodiment, performing this setting permits the equalizers 32A to 32F to have levels for signal components processed therein, with the result that frequency characteristics proper for the locations of the speakers 4A to 4F, environments in the room, and others are set, thus realizing a surround-sound reproduction. The frequency characteristic setting is carried out for each of the speakers 4A to 4F.

First of all, the frequency characteristic setting is performed toward one speaker 4A, during which time a measuring signal SN1 is outputted from the measuring-signal generator 12 (step S11 in FIG. 11).

To be specific, the main controller 74 in the controller 22 sends control signals to the switches 31A to 31F in the signal processing unit 21, so that, of all the switches 31A to 31F, the first switch 31A is forced to switch its inner connections to the side for the measuring signal and the remaining switches 31B to 31F to the opposite side for being separated from the measuring signal.

The main controller 74 makes the measuring-signal generator 12 generate a measuring signal SN1 by giving a control signal thereto.

As a result, the measuring signal SN1 is supplied via the switch 31A to only the path in which the equalizer 32A and delay circuit 33A are inserted. Hence, the measuring signal SN1 is sent to the speaker 14A via the switch 31A, equalizer 32A, delay circuit 33A, D/A converter 13A and variable amplifier 4A, and outputted from the speaker 14A.

Incidentally, this measuring signal SN1 has a frequency band covering an audible frequency range for the human (for instance, 20 Hz to 20 kHz).

The sound in response to the measuring signal SN1, which has outputted from the speakers 4A to 4F respectively, is picked up by the microphone 5. The electronic signal picked up by the microphone 5, which has responded to the measuring signal SN1, is sent to the controller 22 as a sound-collected signal ST via the amplifier 15 and A/D converter 16. Further, in the controller 22, the band-pass filter unit 81 in the frequency characteristic controller 71 operates to divide the supplied sound-collected signal ST into signal components falling into a plurality of frequency bands (step S12).

As shown in FIG. 12, the plural frequency bands handled by the band-pass filter unit 81 are nine band in total; that is, in terms of central frequencies, 63 Hz, 125 Hz, 250 Hz, 500 Hz, 1 kHz, 2 kHz, 4 kHz, 8 kHz and 16 kHz.

The frequency characteristic calculator 82 receives the outputs from the band-pass filter unit 81, which are the signal components of the sound-collected signal ST, which are now divided into the nine frequency bands, and groups them into six frequency-band signal components (step S13).

Practically, in the calculator 82, the frequency bands falling into a range of 500 Hz to 2 kHz are grouped as one band and the frequency bands falling into a range of 8 kHz to 16 kHz is grouped as another band. The central frequency of the range of 8 kHz to 16 kHz is 11.3 kHz, as shown in FIG. 13.

The frequency characteristic calculator 82 then detects the levels of the signal components in the six frequency bands of the sound-collected signal ST (step S14).

From the levels of the signal components in the six frequency bands shown in FIG. 14, the frequency characteristic calculator 82 calculates an inverse frequency characteristic to the frequency characteristic of the sound-collected signal ST (step S15). This inverse frequency characteristic exemplified in FIG. 15 composes a target frequency characteristic.

The frequency characteristic calculator 82 then calculates relatively levels of signal components in the variable-level bands on the basis of a level of a signal component in the fixed-level band in the inverse frequency characteristic (step S16).

This calculation can be detailed as follows. As described before, in the present embodiment, the fixed-level band is 500 Hz to 2 kHz, while the variable-level bands are composed of the remaining five bands of which center frequencies are 63 Hz, 125 Hz, 250 Hz, 4 kHz and 11.3 kHz. Hence, the frequency characteristic calculator 82 employs, as a reference level, the level provided by a signal component in the range of 500 Hz to 2 kHz in the inverse frequency characteristic of the sound-collected signal ST and calculates a relative level difference between the reference level and each of the levels provided by the remaining five bands.

As shown in FIG. 5, the band of 500 Hz to 2 kHz, which is assigned to the fixed-level band, is set to a level of 0 dB.

The frequency characteristic calculator 82 then outputs level control signals LA1 to LA5 each corresponding to the relative level differences in the relative frequency characteristic shown in FIG. 15, toward the level setting units 51 to 55 of the equalizer 32A, respectively (step S17). Therefore, the levels in the individual bands of the relative frequency characteristic are set to the level setting units 51 to 55 of the equalizer 32A.

Since the level in the range of 500 Hz to 2 kHz (i.e., the fixed-level band) is 0 dB, it is unnecessary to set this level to the equalizer 32A. Thus, as shown in FIG. 7, one level setting unit is removed from the path for the fixed-level band in the equalizer 32A.

The main controller 72 then determines whether or not the processing of steps S12 to S17 has already been repeated four times (step S18).

In the present embodiment, the four-time repeated performance of the same processing as for each speaker will lower or eliminates errors associated with setting levels to the signal components in the plural frequency ranges in each equalizer.

On having completed the four-time repetition of the processing at steps S12 to S17 toward the single speaker 4A, the main controller 74 moves its processing to step S19 to determine whether or not the above frequency characteristic setting has already been carried out for all the cannels. If this determination reveals that some channels that should be processed are still left, the processing is made to return to step S11 to perform the frequency characteristic setting for the next speaker 4B.

Precisely, the main controller 74 sends the control signals to the switches 31A to 31F in the signal processing unit 21, so that, of all the switches 31A to 31F, the second switch 31B is forced to switch its inner connections to the side for the measuring signal and the remaining switches 31A and 31C to 31F to the opposite side for being separated from the measuring signal. Thus the measuring signal SN1 passes only the switch 31B to enter the path in which the equalizer 32B and the delay circuit 33B are inserted.

The foregoing processing on steps S12 to S18 is therefore executed to set levels to the plural frequency bands in the equalizer 32B.

Like the above, the main controller 74 will perform the frequency characteristic setting toward the remaining speakers 4C to 4F in turn, so that desired levels are assigned to the plural frequency bands in each of the equalizers 32C to 32F.

When the main controller 74 determines that the frequency characteristic setting for all the channels has been completed (YES at step S19), the main controller 74 sends to the measuring-signal generator 12 a control signal indicative of stopping the measuring signal SN1. Hence the output of the measuring signal SN1 is stopped and the frequency characteristic setting is terminated.

The delay characteristic setting carried out in the present embodiment will now be described.

The delay characteristic setting is processing for setting delay amounts (amounts in time) to the delay circuits 33A to 33F in the signal processing unit 21. When such delay amounts the delay circuits 33A to 33F are decided through the delay characteristic setting, the delay amounts of the six-channel video signals SA to SF are made to agree with each other in reproducing a DVD, thus realizing a surround-sound reproduction.

The delay characteristic setting is carried out by both of the main controller 74 and the delay-characteristic controller 72 toward each of the speakers 4A to 4F, like the foregoing frequency characteristic setting.

Practically, the main controller 74 controls each of the switches 31A to 31F in the signal processing unit 21, so that the measuring signal SN2 is supplied to the six paths connecting to the speakers 4A to 4F in sequence.

The measuring signal SN2 has a frequency band suitable for analyzing and setting delay characteristics. On the other hand, the delay characteristic controller 72 is formed to analyze a delay characteristic channel by channel using the sound-collected signal ST and estimate delay amounts that should be given to the delay circuits 33A to 33F to make all-channel delay characteristics equal to each other.

The thus-estimated delay amounts are reflected in delay control signals DA to DF, which are then supplied to the delay circuits 33A to 33F.

Accordingly, on completion of the delay characteristic setting by giving the delay amounts to delay circuits 33A to 33F, the main controller 74 sends to the measuring-signal generator 12 a control signal to stop the generation of the measuring signal SN2.

Figure 16:
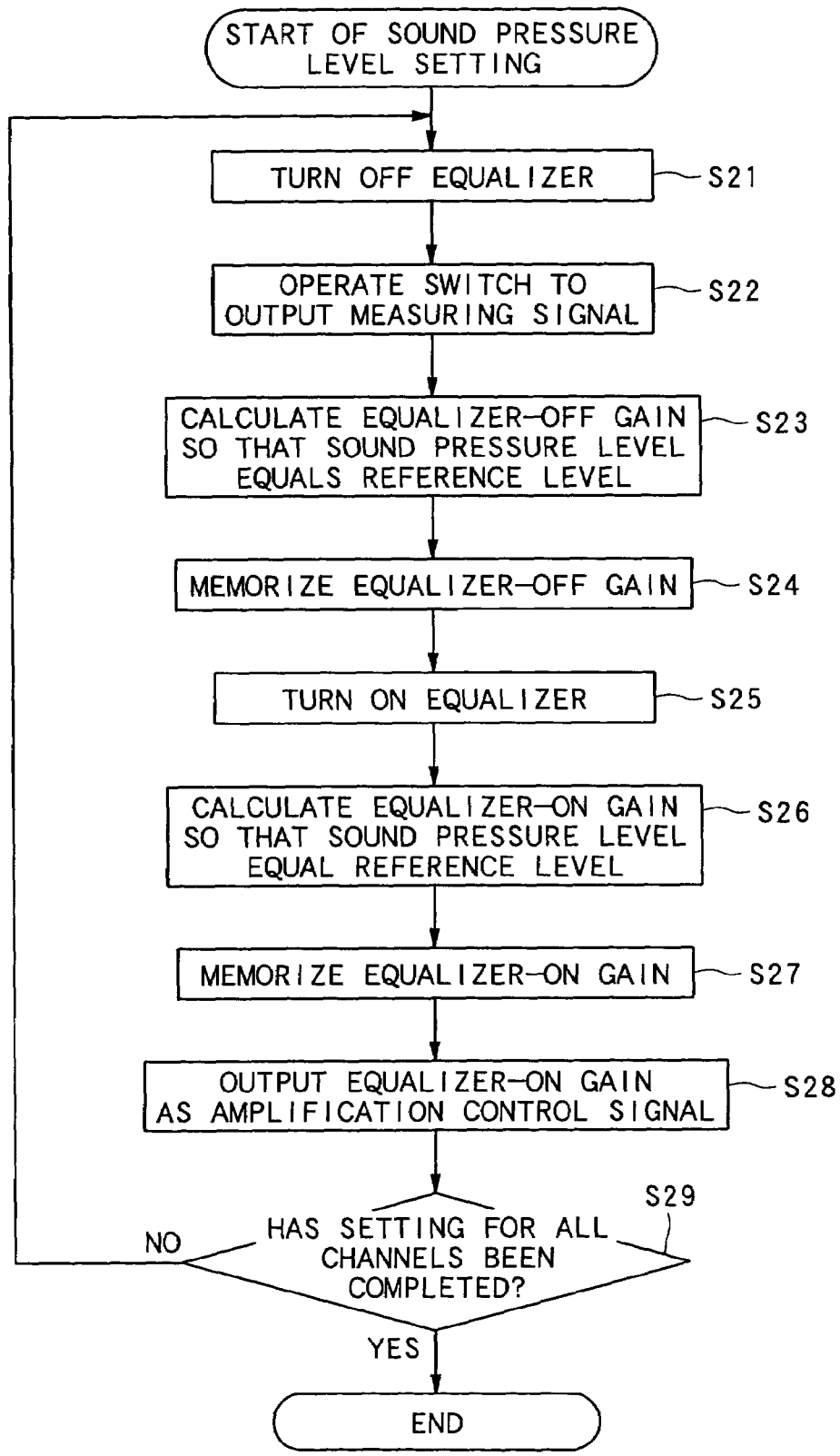
FIG. 16 is a flowchart explaining sound-pressure level setting carried out in the automatic sound-field correction.

Referring to FIG. 16, the sound-pressure level setting for the automatic sound-field correction carried out in the present embodiment will now be described. FIG. 16 outlines the procedures for the sound-pressure level setting.

The sound-pressure level setting is processing for setting (adjusting) a gain at each of the variable amplifiers 14A to 14F. Setting the gains at the variable amplifiers 14A to 14F through this setting makes it possible that sound pressure levels of all-channel audio signals are made to be equal to each other when a DVD is subjected to its reproduction, thus leading to a surround-sound reproduction.

In this sound-pressure level setting, the gains at the variable amplifiers 14A to 14F are decided so that two sound pressure levels of audio signals outputted from each of the speakers 4A to 4F in response to the on- and off-states of each of the equalizers 32A to 32F become equal to each other at least on the audibility.

Like the foregoing frequency characteristic setting and delay-characteristic setting, the sound-pressure level setting is performed toward each of the speakers 4A to 4F.

First of all, the first speaker 4A undergoes the sound-pressure level setting.

To be specific, as shown in FIG. 16, the main controller 74 gives the equalizer 32A a control signal to bring the equalizer 32A into its off-state (step S21 in FIG. 16). Then the main controller 74 controls the switches 31A to 31F in such a manner that only a path connecting the measuring-signal generator 12 and the speaker 4A become active and controls the measuring-signal generator 12 to output a measuring signal SN3 (step S22).

Hence, the measuring signal SN3 is supplied to the speaker 4A through the off-state equalizer 32A and others, and outputted from the speaker 4A.

The frequency band of the measuring signal SN3 is matched with a range (such as 500 Hz to 2 kHz) in which changes in sound pressure are sensitive to human audibility. When such a human-sensitive frequency band is included into the frequency band of the measuring signal SN3, the gains at the variable amplifiers 14A to 14F can be decided such that two sound pressure levels of audio signals outputted from each of the speakers 4A to 4F in response to the on-state and off-state of each of the equalizers 32A to 32F become equal to each other on the human audibility.

The measuring signal SN3 outputted as sound from the speaker 4A is picked up by the microphone 5, and supplied as a sound-collected signal ST to the amplification controller 73 placed in the controller 22 in the signal processor 11 (refer to FIG. 6).

In response to this supply, the amplification controller 73 reads out a reference level for sound pressure stored in the memory 92, and calculates a gain at the variable amplifier 14A. The gain makes the sound pressure level of the sound-collected signal ST equal the reference level (step S23). This gain is memorized as an equalizer-off gain into the memory 92 (step S24).

Then, the main controller 74 issues a control signal to turn on the equalizer 32A (step S25).

Hence, the measuring signal SN3 is supplied to the speaker 4A through the on-state equalizer 32A and others, and outputted from the speaker 4A. The measuring signal SN3 outputted as sound from the speaker 4A is routed as a sound-collected signal ST to the amplification controller 73 via the microphone 5 and others.

Responsively to this, the amplification controller 73 reads out again the reference level stored in the memory 92, and calculates a gain at the variable amplifier 14A, the gain making the sound pressure level of the sound-collected signal ST equal the reference level (step S26). This gain is refereed to as an "equalizer-on gain" in this embodiment.

The amplification controller 73 then stores this equalizer-on gain into the memory 92 (step S27), and sends the equalizer-on gain to the variable amplifier 14A as an amplification control signal AA (step S28).

As a result, this allows the gain at the variable amplifier 14A to be assigned to the equalizer-on gain.

The main controller 74 will perform the above processing at steps S21 to S28 toward the remaining speakers 4B to 4F in sequence, during which time the main controller 74 examines if the above processing has been completed with all the channels (step S29). In cases where the sound-pressure level setting has been completed with all the channels, the main controller 74 makes the measuring-signal generator 12 stop the generation of the measuring signal SN3, thus the sound-pressure level setting being terminated.

In the above sound-pressure level processing, as to each of the channels, both of the equalizer-off gain and the equalizer-on gain are calculated. Hence, the calculation of the equalizer-off gain with all the channels results in that the sound pressure levels on the audibility become equal to each other among all the channels when the equalizers 32A to 32F are in their off-states. Like the above, the calculation of the equalizer-on gain with all the channels results in that the sound pressure levels on the audibility become equal to each other among all the channels when the equalizers 32A to 32F are in their on-states.

Accordingly, thanks to the calculation of the equalizer-off and equalizer-on gains, the sound pressure levels on the audibility can be set to the same level when the equalizers 32A to 32F are in their on-states and in their off-states.

In reproducing a DVD, when the equalizers are turned off, the equalizer-off gains stored the memory 92 in the amplification controller 73 are read out. The read-out equalizer-off gains are sent as amplification control signals AA to AF to the variable amplifiers 14A to 14F, thereby the equalizer-off gains being set to the amplifiers 14A to 14F.

By contrast, in reproducing a DVD, when the equalizers are turned on, the equalizer-on gains stored the memory 92 in the amplification controller 73 are read out. The read-out equalizer-on gains are sent as amplification control signals AA to AF to the variable amplifiers 14A to 14F, thereby the equalizer-on gains being set to the amplifiers 14A to 14F.

In consequence, turning on/off the equalizers 32A to 32F will cause no change in the sound pressure levels of the audio signals SA to SF on the audibility. In the case of the above sound-pressure level setting, since the automatic sound-field correction terminates with the equalizers 32A to 32F kept their on-states, the equalizer-on gains are set to the variable amplifiers 14A to 14F.

As described above, the amplifying unit 3 of the present embodiment provides the configuration for the frequency characteristic setting, with which a relative signal-component level in each variable-level band is estimated on the basis of a signal-component level in a fixed-level band of the an inverse frequency characteristic (i.e., target frequency characteristic) of a sound-collected signal ST and the signal-component levels in all the bands of each of the equalizers 32A to 32F are set using the relative signal-component levels in the variable-level bands. Thus, without causing the level of a signal component in the fixed-level band to be changed, the frequency characteristics of audio signals SA to SF can be adjusted.

Accordingly, in the present embodiment, it is unnecessary to arrange means for setting the signal-component level in the fixed-level band.

Concretely, as shown in FIG. 8, the equalizers 32A to 32F divide the frequency bands of each of the audio signals SA to SF into the six bands, with no level setting unit for the fixed-level band (500 Hz to 2 kHz).

It is still sufficient to calculate relative levels in the five variable-level bands during the operation of the frequency characteristic setting. As to the level control for each of the equalizers 32A to 32F, which is carried out by the frequency characteristic controller 71, it is sufficient to handle the five variable-level bands.

As a result, from a substantial viewpoint, by using the five mechanisms for the five frequency bands and performing the processing on the five frequency bands, the frequency characteristic setting for the six frequency bands can be realized in consequence, while still maintaining frequency resolution, that is, accuracy in adjusting the frequency characteristics. It is therefore possible to reduce cost for manufacturing the amplifying unit 3.

Further, in the amplifying unit 3 according to the present embodiment, because the fixed-level band for the frequency characteristic setting is assigned to a range of 500 Hz to 2 kHz, changes in the sound pressure level of the audio signals SA to SF on the audibility can be reduced when the frequency characteristics of the audio signals SA to SF are changed through the equalizers 32A to 32F.

Further, the equalizers 32A to 32F adopted in the present embodiment prevent the sound pressure levels of the audio signals SA to SF from fluctuating largely on the audibility. Hence the sound pressure levels cannot be reduced in a larger extent.

It is therefore enough for the variable amplifiers 14A to 14F placed after the equalizers 32A to 32F to amplify only a smaller amount of signal for each of the audio signals SA to SF. This prevents the situation where noise caused by the D/A converters 13A to 13F is amplified, together with the audio signals, by the variable amplifiers 14A to 14F.

The noise outputted, in a mixed state with the audio signals SA to SF, from the speakers 4A to 4F can be lessened, thus leading to a higher-quality reproduction of music and movies.

Still further, in the sound-pressure level setting, the gains at the variable amplifiers 14A to 14F are decided so that the sound pressure levels of the audio signals becomes equal between the on-states and off-state of the equalizers 32A to 32F. The situation where the sound pressure levels are fluctuated due to whether the equalizers 32A to 32F are in their on-states or off-states can be eliminated.

In the case of the sound-pressure level setting, the measuring signal SN3 used for measuring sound pressure levels is designed to have a frequency band that makes the human audibility sensitive to changes in the sound pressure level. A difference of sound pressure levels of an audio signal between the on-states and off-state of the equalizers 32A to 32F can be reduced or eliminated on the audibility.

As a result, changes in the sound pressure levels can be corrected in a frequency band sensitive to the human audibility, thus making the sound-pressure level setting more efficient.

In the foregoing embodiment, the frequency band of the measuring signal SN3 is set to a range of 500 Hz to 2 kHz, which is made to agree with the fixed-level band. It is preferred to adopt such a common setting manner, because changes in sound pressure levels in such a range are sensitive to the human audibility. However, it is not always necessary to make both of the frequency bands agree with each other. For instance, the central frequency of the measuring signal SN3 may be set to 1 kHz.

Although the foregoing embodiment has been explained about the example in which an audio signal is divided into its signal components in the six frequency bands, channel by channel, and the frequency characteristic setting is carried out for each frequency band, this is not a definitive list. The number of frequency bands to be divided may simply be two or more.

Furthermore, in the foregoing embodiment, the central frequency of each frequency band is not confined to the above explained values. In the frequency characteristic setting carried out in the foregoing embodiment, the sound-collected signal has been subjected to grouping its frequency components. The present invention can, however, be reduced into practice with no grouping processing.

Still further, the frequency characteristic setting according to the above embodiment has been carried out using the configuration of supplying relative levels in the variable-level bands to the equalizers 32A to 32F as the level control signals LA to LF. As for this configuration, other modifications can be provided within the scope of the present invention. By way of example, such relative levels from the variable-level bands may be subjected to a desired type of processing (such as, addition of a pre-given offset level, multiplication of a specified factor) and resultant processed levels are provided to the equalizers 32A to 32F as the level control signals LA to LF.

In such a case, the advantages similar to the above can be obtained, as long as the characteristic of an audio signal can be controlled to be in agreement with a target frequency characteristic, with no change added to a level of a signal component in the fixed-level band.

For the sake of completeness, it should be mentioned that the embodiment explained so far is not a definitive list of possible embodiments of the present invention. The expert will appreciate that it is possible to combine the various construction details or to supplement or modify them by measures known from the prior art without departing from the basic inventive principle.

The entire disclosure of Japanese Patent Application No. 2002-211684 filed on Jul. 19, 2002 including the specification, claims, drawings and summary is incorporated herein by reference in its entirety.

What is claimed is:

1. A frequency characteristic adjustment apparatus in which an inputted signal is subjected to adjustment for making a frequency characteristic of the signal agree with a target frequency characteristic, the apparatus comprising:

an estimation device configured to divide the inputted signal into a signal component falling into a one fixed-level band and one or more signal components falling into one or more variable-level bands and to estimate a relative level of the signal component in each variable-level band on the basis of a level of the signal component in the fixed-level band in the target frequency characteristic;

an adjustment device configured to adjust the level of the signal component of each variable-level band of the signal based on the estimated relative level of the signal component in each variable-level band; and an output device configured to output the signal adjusted by the adjustment device.

2. The frequency characteristic adjustment apparatus according to claim 1, wherein the inputted signal is composed of an audio signal, and the estimation device is configured to assign, to the fixed-level band, a predetermined frequency band in which changes in sound pressure are sensitive to human audibility and to divide the inputted signal.

3. A frequency characteristic adjustment apparatus, comprising:

an adjustment device configured to divide an audio signal inputted from outside the apparatus into a signal component falling into one fixed-level band and one or more signal components falling into one or more variable-level bands and to adjust levels of the signal components in only the variable-level bands of the audio signal; and an output device configured to output the audio signal adjusted by the adjustment device, wherein the adjustment device is configured to assign, to the fixed-level band, a predetermined frequency band in which changes in sound pressure are sensitive to human audibility and to divide the inputted audio signal.

4. The frequency characteristic adjustment apparatus according to claim 2, wherein the predetermined frequency band assigned to the fixed-level band by the adjustment device includes a frequency of 1 kHz in the inputted signal.

5. The frequency characteristic adjustment apparatus according to claim 2, wherein the predetermined frequency band assigned to the fixed-level band by the adjustment device includes a predetermined frequency range from 500 Hz to 2 kHz in the inputted signal.

6. The frequency characteristic adjustment apparatus according to claim 2, wherein the predetermined frequency band assigned to the fixed-level band by the adjustment device includes a predetermined frequency range included in a range of 500 Hz to 2 kHz in the inputted signal.

7. The frequency characteristic adjustment apparatus according to claim 2, further comprising a level adjustment device configured to adjust a level of the signal outputted from the output device so that the inputted signal and the signal outputted from the output device are made to be equal in signal levels to each other.

8. The frequency characteristic adjustment apparatus according to claim 2, further comprising a measuring-signal generation device configured to provide, to a reception device configured to receive the inputted signal, a measuring signal having a predetermined frequency band in which changes in sound pressure are sensitive to human audibility.

9. A computer readable medium storing a program, carried out by a computer, for adjusting a frequency characteristic of an inputted signal so that the frequency characteristic of the signal agrees with a target frequency characteristic, the program making the computer have the functions of:

receiving the inputted signal;

dividing the inputted signal into a signal component falling into a one fixed-level band and one or more signal components falling into one or more variable-level bands;

estimating a relative level of the signal component in each variable-level band on the basis of a level of the signal component in the fixed-level band in the target frequency characteristic;

adjusting the level of the signal component of each variable-level band of the signal based on the estimated relative level of the signal component in each variable-level band; and outputting the adjusted signal.

10. A computer readable medium storing a program, carried out by a computer, for adjusting a frequency characteristic of an inputted audio signal so that the frequency characteristic of the signal agrees with a target frequency characteristic, the program making the computer have the functions of:

receiving the inputted audio signal;

dividing the received audio signal into a signal component falling into one fixed-level band and one or more signal components falling into one or more variable-level bands, a predetermined frequency band in which changes in sound pressure are sensitive to human audibility being assigned to the fixed-level band;

adjusting levels of the signal components in only the variable-level bands of the audio signal; and outputting the adjusted audio signal.

11. A method of adjusting a frequency characteristic of an inputted signal so that the frequency characteristic of the signal agrees with a target frequency characteristic, the method comprising the steps of:

receiving the inputted signal;

dividing the received signal into a signal component falling into a one fixed-level band and one or more signal components falling into one or more variable-level bands;

estimating a relative level of the signal component in each variable-level band on the basis of a level of the signal component in the fixed-level band in the target frequency characteristic;

adjusting the level of the signal component of each variable-level band of the signal based on the estimated relative level of the signal component in each variable-level band; and outputting the signal adjusted by the adjustment step.

12. A method of adjusting a frequency characteristic of an inputted audio signal so that the frequency characteristic of the audio signal agrees with a target frequency characteristic, the method comprising the steps of:

receiving the inputted audio signal;

dividing the received audio signal into a signal component falling into one fixed-level band and one or more signal components falling into one or more variable-level bands, a predetermined frequency band in which changes in sound pressure are sensitive to human audibility being assigned to the fixed-level band;

adjusting levels of the signal components in only the variable-level bands of the audio signal; and outputting the audio signal adjusted by the adjustment step.

* * * * *